(12) United States Patent
Qi et al.

(10) Patent No.: US 12,342,724 B2
(45) Date of Patent: Jun. 24, 2025

(54) VIBRATION PANEL AND DRIVE METHOD THEREFOR, AND HAPTIC FEEDBACK DEVICE

(71) Applicant: BOE Technology Group Co., Ltd., Beijing (CN)

(72) Inventors: Dexing Qi, Beijing (CN); Yuju Chen, Beijing (CN); Hui Hua, Beijing (CN); Yingzi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/006,458

(22) PCT Filed: Jan. 29, 2022

(86) PCT No.: PCT/CN2022/074982
§ 371 (c)(1),
(2) Date: Jan. 23, 2023

(87) PCT Pub. No.: WO2023/142038
PCT Pub. Date: Aug. 3, 2023

(65) Prior Publication Data
US 2024/0260474 A1    Aug. 1, 2024

(51) Int. Cl.
*G06F 3/041* (2006.01)
*G06F 3/01* (2006.01)
*H10N 30/20* (2023.01)
*H10N 30/88* (2023.01)

(52) U.S. Cl.
CPC ............ *H10N 30/20* (2023.02); *G06F 3/016* (2013.01); *G06F 3/041* (2013.01); *H10N 30/88* (2023.02)

(58) Field of Classification Search
CPC ....... B06B 1/0603; B06B 1/0611; G08B 6/00; H04R 1/028; H04R 17/00; H04R 17/005; H04R 2400/03; H04R 2499/15; H04R 7/10; H10N 30/204; H10N 30/50; H10N 30/708; H10N 30/8536; H10N 30/8554; H10N 30/875; H10N 30/877; H10N 30/88
See application file for complete search history.

(56) References Cited

U.S. PATENT DOCUMENTS

| | | |
|---|---|---|
| 2005/0023937 A1 | 2/2005 | Sashida et al. |
| 2005/0052261 A1 | 3/2005 | Yoon et al. |
| 2006/0181522 A1 | 8/2006 | Nishimura et al. |

(Continued)

FOREIGN PATENT DOCUMENTS

| | | |
|---|---|---|
| CN | 1595798 A | 3/2005 |
| CN | 1815427 A | 8/2006 |

(Continued)

*Primary Examiner* — Insa Sadio
(74) *Attorney, Agent, or Firm* — Workman Nydegger

(57) ABSTRACT

Embodiments in the present disclosure provide a vibration panel and a drive method therefor, and a haptic feedback device. The vibration panel includes: a substrate; a piezoelectric sensor located on one side of the substrate, where the piezoelectric sensor driven by an excitation signal is configured to vibrate, and to drive the substrate to vibrate; and a regulation structure, where the regulation structure is configured to regulate a characteristic frequency of the substrate, so as to make a resonant frequency of the substrate satisfy a preset range.

19 Claims, 18 Drawing Sheets

316.92Hz

(56) References Cited

U.S. PATENT DOCUMENTS

| | | | |
|---|---|---|---|
| 2013/0093577 A1 | 4/2013 | Park et al. | |
| 2013/0106239 A1 | 5/2013 | Yun et al. | |
| 2013/0141225 A1 | 6/2013 | Son et al. | |
| 2013/0162415 A1 | 6/2013 | Kim et al. | |
| 2016/0018893 A1 | 1/2016 | Choi et al. | |
| 2018/0198052 A1 | 7/2018 | Park | |
| 2020/0314552 A1 | 10/2020 | Kim et al. | |
| 2021/0060611 A1 | 3/2021 | Ishii et al. | |
| 2021/0404866 A1* | 12/2021 | Kimura | H10N 30/302 |
| 2021/0409871 A1* | 12/2021 | Lee | H10N 30/883 |

FOREIGN PATENT DOCUMENTS

| | | |
|---|---|---|
| CN | 101656905 A | 2/2010 |
| CN | 103064511 A | 4/2013 |
| CN | 103092336 A | 5/2013 |
| CN | 103116396 A | 5/2013 |
| CN | 103176600 A | 6/2013 |
| CN | 105204687 A | 12/2015 |
| CN | 110178380 A | 8/2019 |
| CN | 111754901 A | 10/2020 |
| CN | 212484312 U | 2/2021 |
| CN | 112445334 A | 3/2021 |

\* cited by examiner

-- Prior Art --

316.92Hz 329.73Hz

724Hz 757.84Hz 896.65Hz

1015Hz 636.03Hz 840.9Hz 1143.9Hz

VIBRATION PANEL AND DRIVE METHOD THEREFOR, AND HAPTIC FEEDBACK DEVICE

CROSS-REFERENCE OF RELATED APPLICATIONS

The present application is a national phase entry under 35 U.S.C. § 371 of International Application No. PCT/CN2022/074982, filed on Jan. 29, 2022.

FIELD

The present disclosure relates to the technical field of haptics, in particular to a vibration panel and a drive method therefor, and a haptic feedback device.

BACKGROUND

Haptics is a focus of current scientific and technological development. In particular, by using haptics, interaction between a human body and a terminal can be achieved through tactile sense.

SUMMARY

Embodiments of the present disclosure provide a vibration panel and a drive method therefor, and a haptic feedback device. The solutions are as follows.

The vibration panel provided in embodiments of the present disclosure includes:
 a substrate;
 a piezoelectric sensor located on one side of the substrate, where the piezoelectric sensor driven by an excitation signal is configured to vibrate, and to drive the substrate to vibrate; and
 a regulation structure, where the regulation structure is configured to regulate a characteristic frequency of the substrate, so as to make a resonant frequency of the substrate satisfy a preset range.

In a possible implementation, according to the vibration panel provided in the embodiments of the present disclosure, the regulation structure includes one or a combination of a support layer, a weight layer, and a regulation film layer, and one or a combination of the support layer, the weight layer, and the regulation film layer are fixedly connected to the substrate.

In a possible implementation, according to the vibration panel provided in the embodiments of the present disclosure, the support layer and the piezoelectric sensor are located on the same side of the substrate.

In a possible implementation, according to the vibration panel provided in the embodiments of the present disclosure, the support layer includes first support portion(s) located in a peripheral area of the substrate and arranged around the piezoelectric sensor.

In a possible implementation, according to the vibration panel provided in the embodiments of the present disclosure, a plurality of first support portions are provided.

In a possible implementation, according to the vibration panel provided in the embodiments of the present disclosure, a shape of an orthographic projection of each of the first support portions on the substrate includes a rectangle, a triangle, a circle, a trapezoid, or a polygon.

In a possible implementation, according to the vibration panel provided in the embodiments of the present disclosure, a shape of an orthographic projection of each of the first support portions at four corners of the substrate on the substrate is an L shape, and a shape of an orthographic projection of each of the remaining first support portions on the substrate includes a rectangle, a triangle, a circle, a trapezoid, or a polygon.

In a possible implementation, according to the vibration panel provided in the embodiments of the present disclosure, the first support portion(s) is/are of a closed annular structure arranged around the piezoelectric sensor.

In a possible implementation, according to the vibration panel provided in the embodiments of the present disclosure, the piezoelectric sensor includes a plurality of piezoelectric devices distributed in an array, and the support layer further includes second support portion(s) at gap(s) between the adjacent piezoelectric devices.

In a possible implementation, according to the vibration panel provided in the embodiments of the present disclosure, a shape of an orthographic projection of the second support portion on the substrate includes a rectangle, a triangle, a circle, a trapezoid, or a polygon.

In a possible implementation, according to the vibration panel provided in the embodiments of the present disclosure, a plurality of second support portions are provided between every two adjacent columns of piezoelectric devices, and the second support portion is provided at a central position of every two adjacent rows and two adjacent columns of piezoelectric devices.

In a possible implementation, according to the vibration panel provided in the embodiments of the present disclosure, a material of the support layer includes at least one of rubber, polyfoam, and foam.

In a possible implementation, according to the vibration panel provided in the embodiments of the present disclosure, a material of the support layer includes polydimethylsiloxane.

In a possible implementation, according to the vibration panel provided in the embodiments of the present disclosure, the weight layer and the piezoelectric sensor are located on the same side of the substrate.

In a possible implementation, according to the vibration panel provided in the embodiments of the present disclosure, the piezoelectric sensor includes a plurality of piezoelectric devices distributed in an array, and the weight layer includes mass block(s) located at gap(s) between the adjacent piezoelectric devices.

In a possible implementation, according to the vibration panel provided in the embodiments of the present disclosure, a plurality of the mass blocks are provided between every two adjacent columns of piezoelectric devices, and the mass block is provided at a central position of every two adjacent rows and two adjacent columns of piezoelectric devices.

In a possible implementation, according to the vibration panel provided in the embodiments of the present disclosure, a shape of an orthographic projection of the mass block on the substrate includes at least one of a rectangle, a circle, and a polygon.

In a possible implementation, according to the vibration panel provided in the embodiments of the present disclosure, a material of the mass blocks is the same as a material of the substrate.

In a possible implementation, according to the vibration panel provided in the embodiments of the present disclosure, the regulation film layer is located on a side of the substrate facing away from the piezoelectric sensor.

In a possible implementation, according to the vibration panel provided in the embodiments of the present disclosure, the vibration panel further includes a touch layer located on a side of the substrate facing away from the piezoelectric sensor.

In a possible implementation, according to the vibration panel provided in the embodiments of the present disclosure, the regulation film layer is located on a side of the touch layer facing away from the substrate, or the regulation film layer is located between the substrate and the touch layer.

In a possible implementation, according to the vibration panel provided in the embodiments of the present disclosure, a material of the regulation film layer includes polyethylene terephthalate, polymethyl methacrylate or polyimide.

In a possible implementation, according to the vibration panel provided in the embodiments of the present disclosure, the substrate has a thickness of 0.3 mm-0.8 mm.

Correspondingly, embodiments of the present disclosure further provides a haptic feedback device. The haptic feedback device includes the above vibration panel.

In a possible implementation, according to the haptic feedback device provided in the embodiments of the present disclosure, the haptic feedback device further includes a support substrate located on a side of the piezoelectric sensor facing away from the substrate, where the support substrate is a support frame or a support plate.

In a possible implementation, according to the haptic feedback device provided in the embodiments of the present disclosure, when the support substrate is the support plate and when a regulation structure includes both a support layer and a weight layer, the support layer has a height greater than the weight layer.

Correspondingly, embodiments of the disclosure further provide a drive method for driving the above vibration panel. The drive method includes:
varying a parameter of a regulation structure, to regulate a characteristic frequency of a substrate, so as to make a resonant frequency of the substrate satisfy a preset range; and
loading an excitation signal onto a piezoelectric sensor, where the piezoelectric sensor deforms to drive the substrate to vibrate.

In a possible implementation, according to the drive method provided in the embodiments of the present disclosure, the varying a parameter of a regulation structure includes at least one of:
regulating a thickness of the substrate, regulating connection stiffness of a support layer, regulating mass and a distribution position of a weight layer, and regulating stiffness and mass of a regulation film layer.

DETAILED DESCRIPTION OF THE EMBODIMENTS

Figure 1:
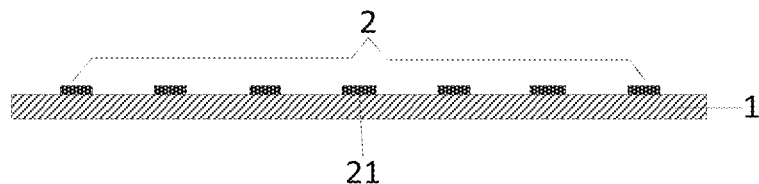
FIG. 1 is a schematic structural diagram of a vibration panel in the related art.

In order to make the objectives, technical solutions, and advantages of the embodiments of the present disclosure clearer, the technical solutions in the embodiments of the present disclosure will be clearly and completely described below with reference to the accompanying drawings in the embodiments of the present disclosure. It is obvious that the described embodiments are some embodiments rather than all embodiments of the present disclosure. Moreover, the embodiments of the present disclosure and features in the embodiments can be combined with one another without conflict. Based on the described embodiments of the present disclosure, all other embodiments acquired by those skilled in the art without making creative efforts fall within the scope of protection of the present disclosure.

Unless otherwise defined, technical or scientific terms used in the present disclosure are to be given their ordinary meaning as understood by those of ordinary skill in the art to which the present disclosure belongs. As used in the present disclosure, words such as "comprise" or "include" mean that elements or items appearing before the word encompass elements or items listed after the word and equivalents thereof, but do not exclude other elements or items. "Connect". "connected" and similar words are not limited to a physical or mechanical connection, but can include an electrical connection, whether direct or indirect. "Inner". "outer". "upper". "lower", etc. are merely used to indicate a relative positional relation, and when an absolute position of the described object is changed, the relative positional relation can also be changed accordingly.

It should be noted that sizes and shapes of all figures in the accompanying drawings do not reflect true scales, and are merely intended to illustrate contents of the present disclosure. Moreover, the same or similar reference numerals denote the same or similar elements or elements having the same or similar function throughout.

The operation principle of a vibration-based haptic reproduction device is typically to implement touch functions such as virtual keys by pasting a piezoelectric patch, a linear motor, or a piezoelectric film on a substrate and applying pulsed excitation. As for a solution using a linear motor, because a size of the linear motor is large, it encroaches on an inner space of an electronic product, resulting in reduction in the size of a battery, thereby shortening the time of endurance of the product. As for a solution using a piezoelectric patch, a voltage amplification device needs to be introduced, on one hand, it encroaches on the battery space, and on the one hand, a high voltage also poses a potential risk of electric shock. As for a solution using a piezoelectric film, since the film typically has a thickness less than 10 μm, a thickness of the device is greatly reduced, the battery space is expanded, and the overall time of endurance of the product is prolonged. Furthermore, the use of the piezoelectric film does not require a high voltage, which guarantees voltage safety of the product. But since the piezoelectric film is too thin, it is difficult to excite the substrate to produce sufficient displacement under an isoelectric field condition, and thus it is difficult for the substrate to produce sufficient haptic feedback. This makes it difficult for the piezoelectric film to be used in a lower frequency (within 1 kHz) range for haptic feedback of buttons, keys, etc.

Figure 2:
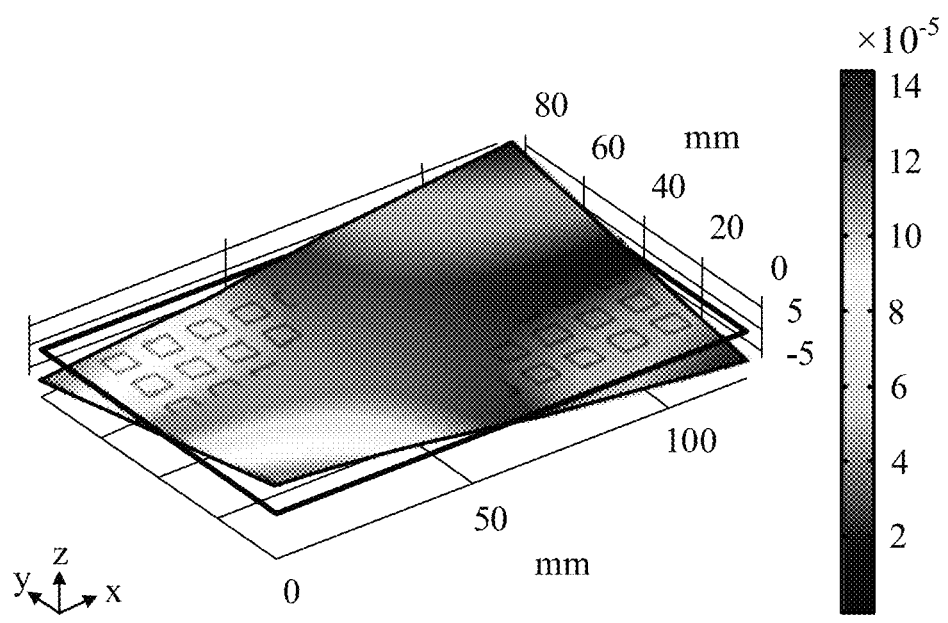
FIGS. 2-7 illustrate several displacement distributions (characteristic modes) calculated in the frequency domain corresponding to characteristic frequencies of a substrate shown in FIG. 1 within 1100 Hz respectively.
Figure 3:
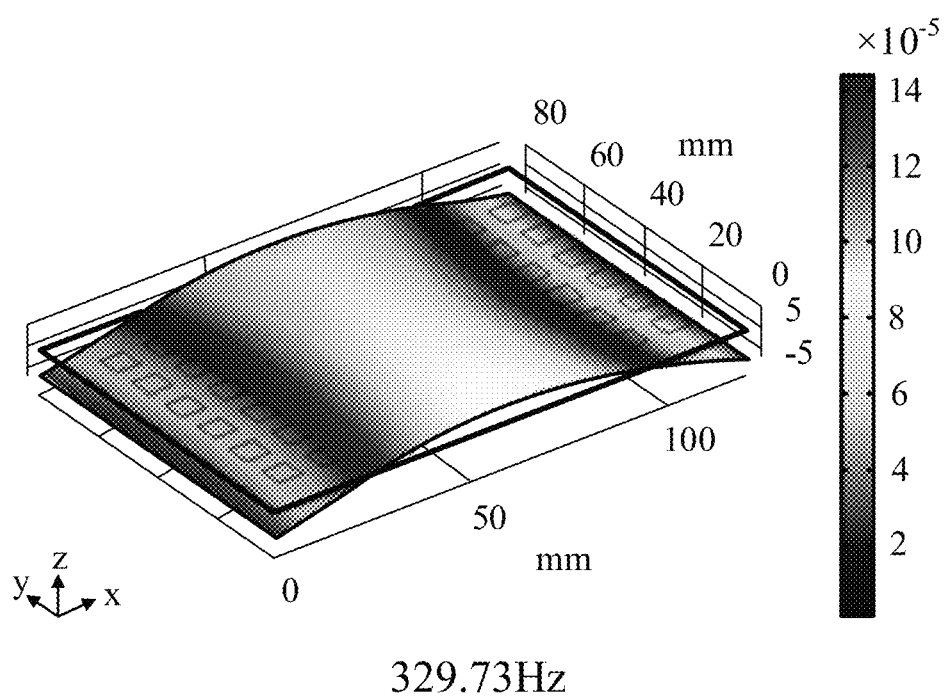
Figure 4:
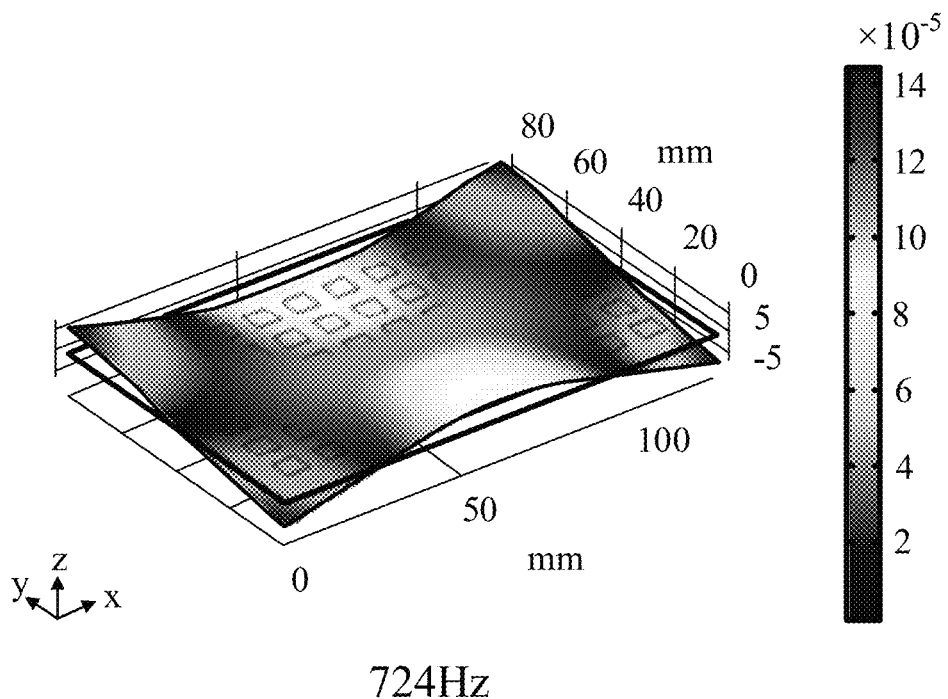
Figure 5:
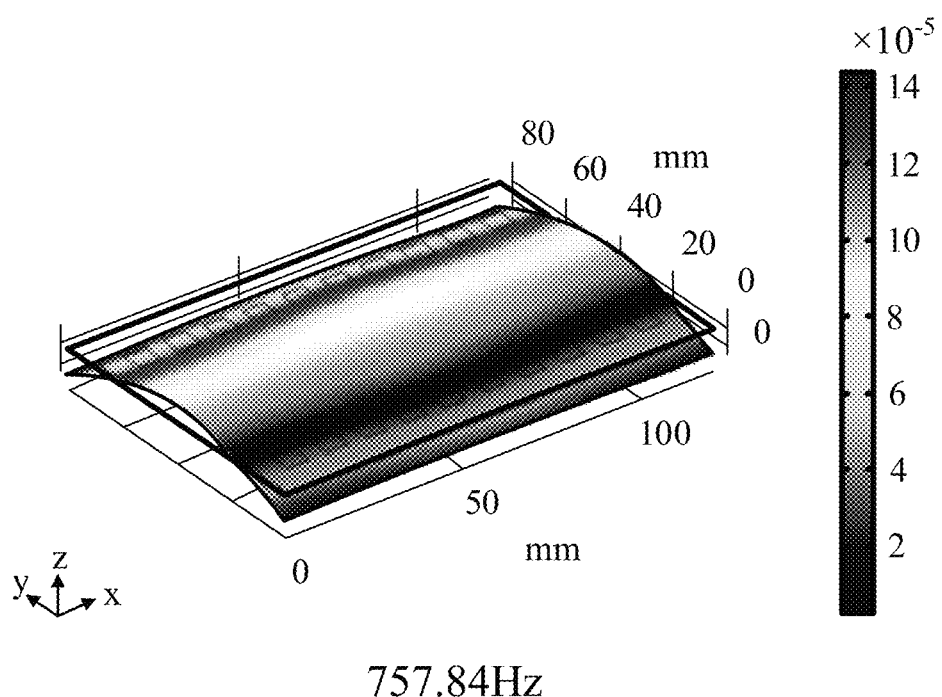
Figure 6:
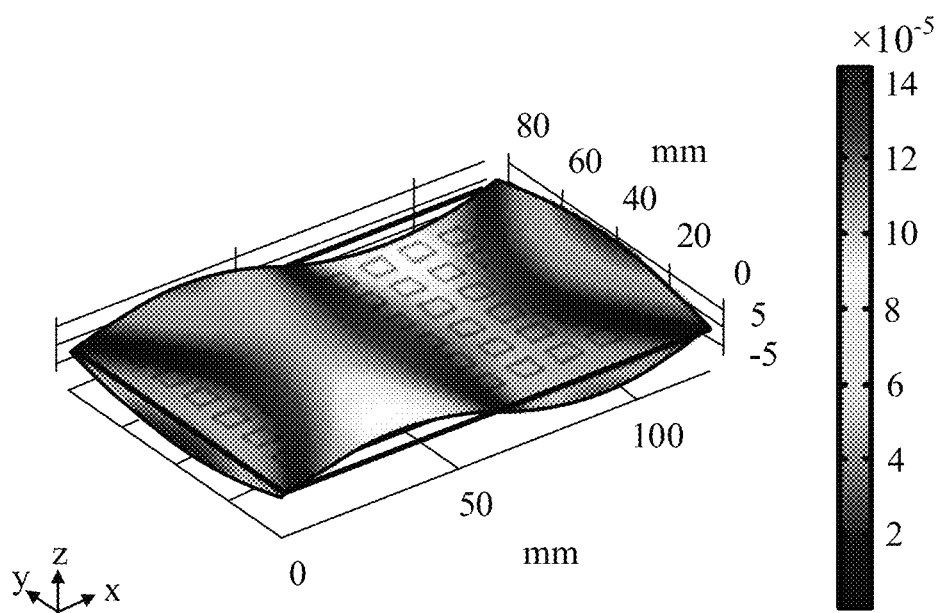
Figure 7:
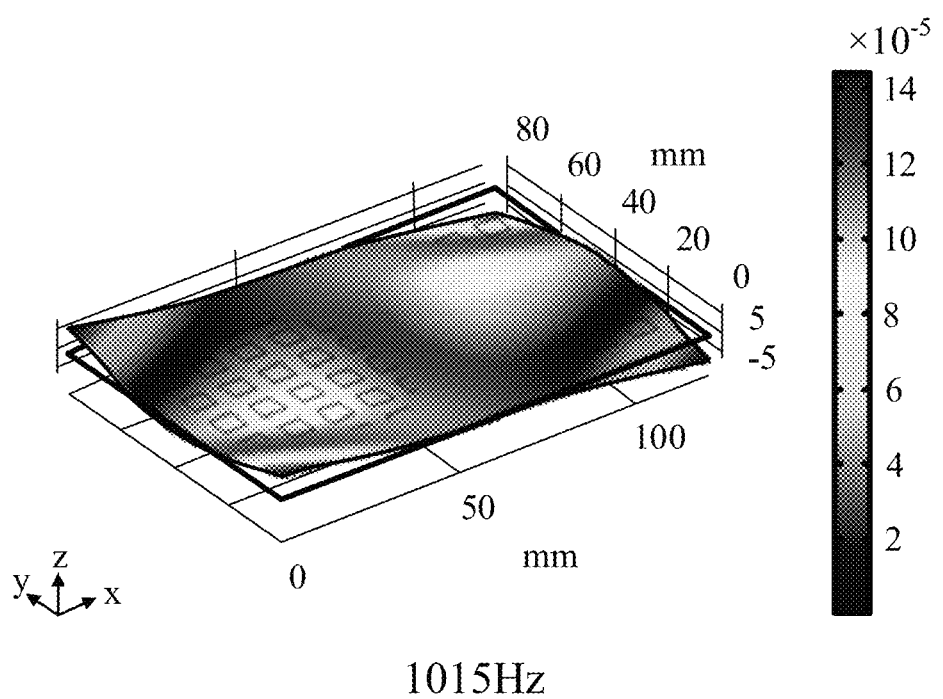
Figure 8:
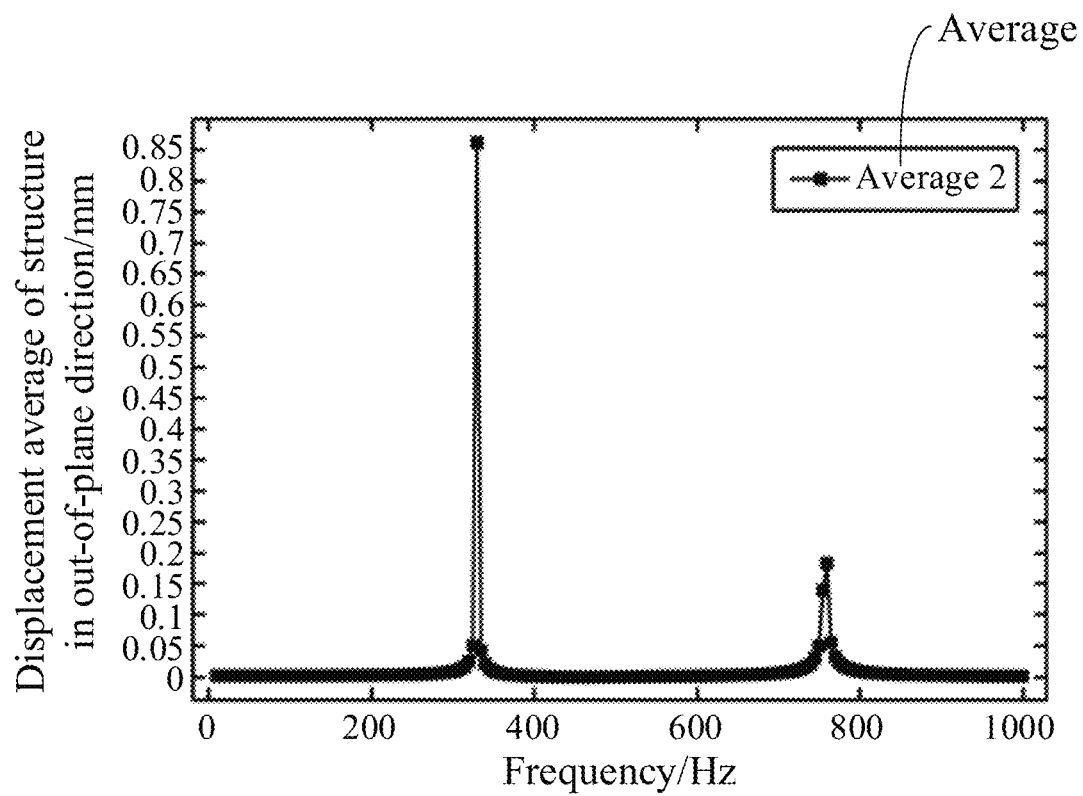
FIG. 8 illustrates a corresponding frequency response curve of a substrate under excitation in a particular frequency range.

In the related art, as shown in FIG. 1, the vibration panel generally includes a substrate 1 and a piezoelectric sensor 2 located on the substrate. The piezoelectric sensor 2 may include a plurality of piezoelectric devices 21 distributed in an array. The piezoelectric device 21 generally includes a bottom electrode and a top electrode that are oppositely arranged, and a piezoelectric layer located between the bottom electrode and the top electrode. The bottom electrode is generally grounded. The piezoelectric layer deforms by loading a high frequency alternating current signal onto the top electrode, to drive the substrate 1 to generate resonance for haptic reproduction. As an instance, the substrate 1 is a glass substrate, the substrate 1 has a dimension of 120 mm×80 mm, and the substrate 1 has a thickness of 0.8 mm. Since the characteristic frequency is an intrinsic property of the structure, the characteristic frequency is fixed when the dimension and material of the substrate 1 are fixed. Tactile organs of humans are only sensitive to vibration stimulation in specific frequency ranges. According to tactile and auditory sensitivity curves, in general, the frequency of hearing insensitivity and tactile sensitivity is within a range of 400 Hz-600 Hz, and the range of perception of each person will be different. As shown in FIGS. 2-8, FIGS. 2-7 illustrate several displacement distributions (characteristic modes) calculated in the frequency domain corresponding to characteristic frequencies of a substrate 1 shown in FIG. 1 within 1100 Hz respectively. FIG. 8 illustrates a corresponding frequency response curve (displacement average of structure in out-of-plane direction-resonant frequency) of a substrate 1 under excitation in a particular frequency range. FIG. 2 illustrates a characteristic mode corresponding to a characteristic frequency of the substrate 1 being 316.92 Hz. FIG. 3 illustrates a characteristic mode corresponding to a characteristic frequency of the substrate 1 being 329.73 Hz. FIG. 4 illustrates a characteristic mode corresponding to a characteristic frequency of the substrate 1 being 724 Hz. FIG. 5 illustrates a characteristic mode corresponding to a characteristic frequency of the substrate 1 being 757.84 Hz. FIG. 6 illustrates a characteristic mode corresponding to a characteristic frequency of the substrate 1 being 896.65 Hz. FIG. 7 illustrates a characteristic mode corresponding to a characteristic frequency of the substrate 1 being 1015 Hz. As can be seen from FIGS. 2-8, the substrate 1 has no corresponding resonance frequency in a range of 400 Hz-600 Hz, which makes it difficult for piezoelectric devices to be used in a lower frequency (within 1 kHz) range for haptic feedback of buttons, keys, etc., such that the characteristic frequency of the substrate 1 needs to be regulated through a specific method.

Figure 21:
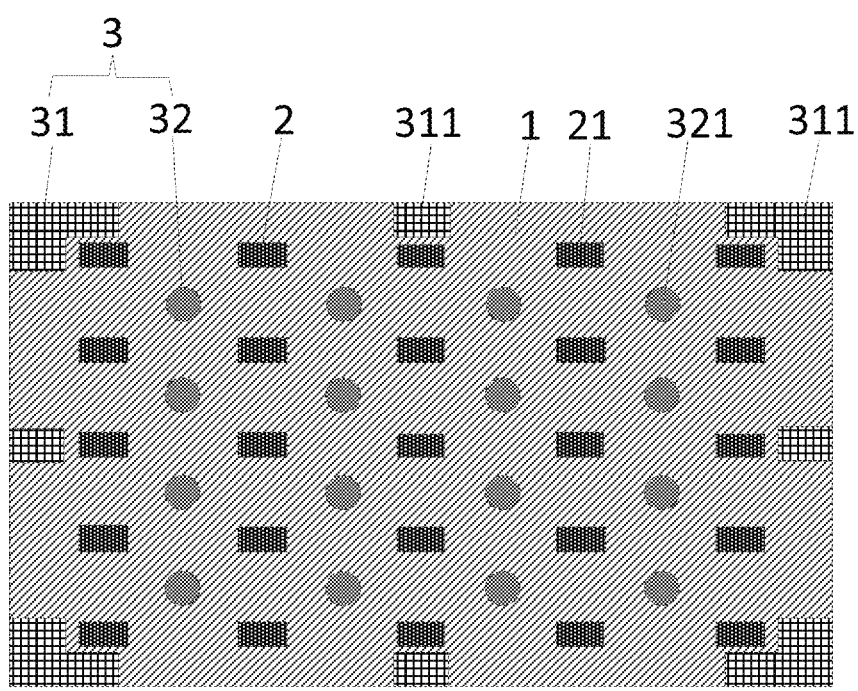
Figure 22:
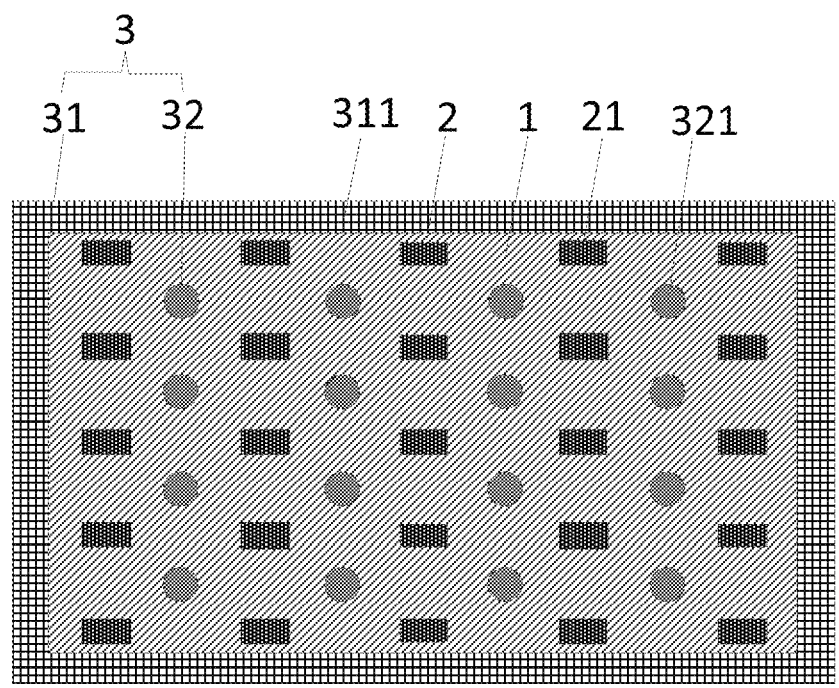
Figure 23:
FIG. 23 is a schematic sectional view of FIGS. 17-22.

In order to solve the problems in the related art, embodiments of the present disclosure provide a vibration panel. As shown in FIGS. 9-27, FIGS. 9-14 are schematic top views of a vibration panel, FIG. 15 is a schematic sectional view of FIGS. 9-11, FIG. 16 is a schematic sectional view of FIGS. 12-14, FIGS. 17-22 are schematic top views of a vibration panel. FIG. 23 is a schematic sectional view of FIGS. 17-22, and FIGS. 24-27 are several other schematic sectional views of a vibration panel.

The vibration panel includes:
a substrate 1;
a piezoelectric sensor 2 located on one side of the substrate 1, where the piezoelectric sensor 2 driven by an excitation signal is configured to vibrate, and to drive the substrate 1 to vibrate; and
a regulation structure 3 configured to regulate a characteristic frequency of the substrate 1, so as to make a resonant frequency of the substrate 1 satisfy a preset range.

The vibration panel provided in the embodiments of the present disclosure is internally provided with the regulation structure, and then the regulation structure may regulate the characteristic frequency and a resonant mode of the substrate, such that the resonant frequency of the substrate satisfies a preset range. The preset range falls within a sensitive frequency range (400 Hz-600 Hz) of a tactile organ of a person. The haptic feedback effect of the haptic feedback device based on excitation vibration of a piezoelectric film in a low frequency range can be improved by using the resonant frequency of the substrate.

It is to be noted that embodiments of the present disclosure are described by taking the sensitive frequency range of a tactile organ of a person being 400 Hz-600 Hz as an instance. Certainly, in practical situations, the sensitive frequency range of a tactile organ of each person may be different (for example 200 Hz-600 Hz, etc.). In embodiments of the present disclosure, the characteristic frequency of the substrate 1 is regulated by means of the regulation structure 3 according to an actual range of the sensitive frequency of a tactile organ of a person.

Figure 28:
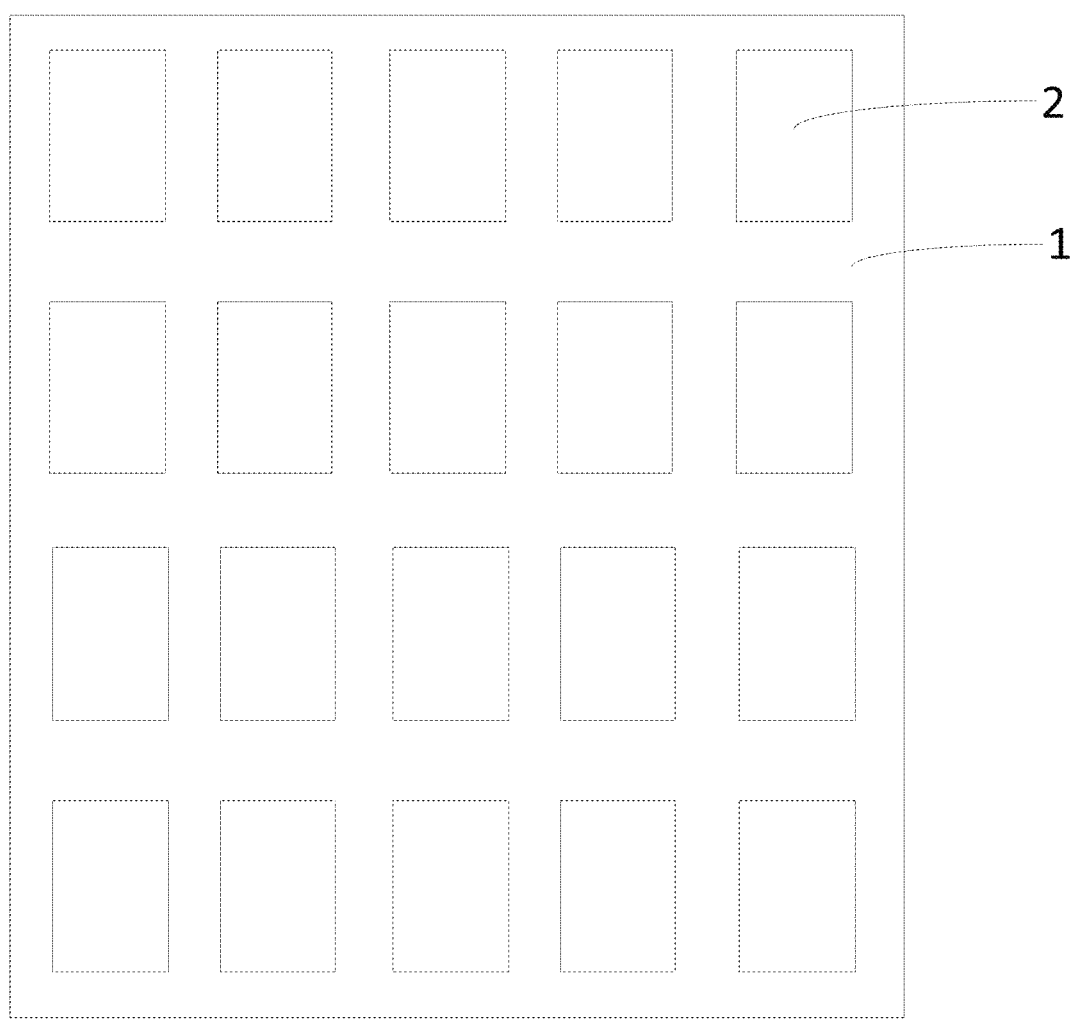
FIG. 28 is a schematic structural diagram of a piezoelectric sensor according to an embodiment of the present disclosure.
Figure 29:
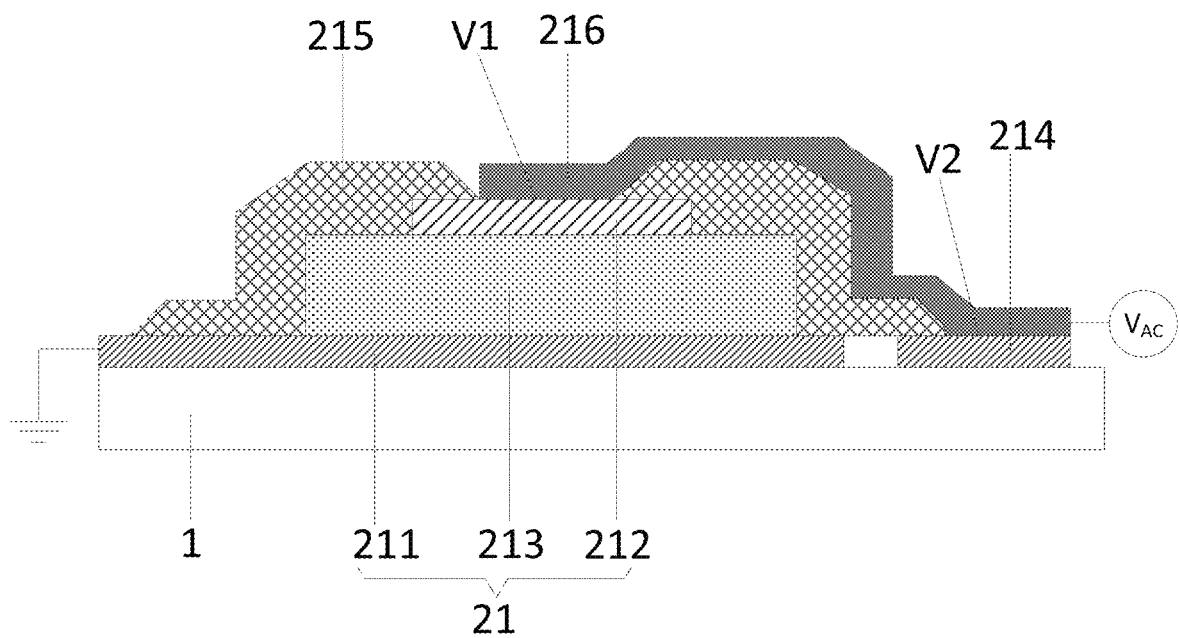
FIG. 29 is a schematic sectional view of the piezoelectric device of FIG. 28.

During implementations, in the above vibration panel provided in the embodiments of the present disclosure, as shown in FIGS. 9-27, the substrate 1 is a substrate making direct contact with fingers and other tactile organs, and may be a notebook touch pad, a display screen, etc. As shown in FIG. 28, the piezoelectric sensor 2 includes a plurality of piezoelectric devices 21 distributed in an array. As shown in FIG. 29. FIG. 29 is a schematic sectional view of a piezoelectric device 21 of FIG. 28. The piezoelectric device 21 includes a bottom electrode 211 and a top electrode 212 that are oppositely arranged, and a piezoelectric layer 213 located between the bottom electrode 211 and the top electrode 212. The piezoelectric sensor 2 may further includes: a binding electrode 214 arranged on the same layer as the bottom electrode 211. The binding electrode 214 is arranged close to an edge of the substrate 1. The binding electrode 214 is used for being connected to a drive voltage input end. A voltage signal input by the drive voltage input end is an alternating voltage signal. The piezoelectric sensor 2 may further include: an insulating layer 215 located on a side of the top electrode 212 facing away from the piezoelectric layer 213, and a wire layer 216 located on a side of the insulating layer 215 facing away from the piezoelectric layer 213.

The insulating layer 215 is provided with a first via hole V1 arranged corresponding to the top electrode 212. One end of the wire layer 216 is electrically connected to the top electrode 212 through the first via hole V1, and the other end of the wire layer 216 is electrically connected to the binding electrode 214 through a second via hole V2 penetrating the insulating layer 215. For example, the bottom electrode 211 is grounded, and the binding electrode 214 is connected to the drive voltage input end. The voltage signal input by the drive voltage input end is an alternating voltage signal. The alternating voltage signal ($V_{AC}$) is loaded onto the top electrode 212 by means of the drive voltage input end, such that an alternating electric field may be formed between the top electrode 212 and the bottom electrode 211, and the alternating electric field has a frequency identical to the alternating voltage signal. Under the action of the alternating electric field, the piezoelectric layer 213 deforms and generates a vibration signal, and the vibration signal has a frequency identical to the alternating electric field. When the frequency of the vibration signal is close to or equal to a natural frequency of the substrate, the substrate resonates, increases in amplitude, and generates a haptic feedback signal. When a finger touches a surface of the substrate, a change in friction force may be noticeably felt. In applications, the frictional force of the surface of the substrate may be regulated by means of resonance generated between the piezoelectric layer and the substrate, so as to achieve texture reproduction of an object at the surface of the substrate.

In embodiments, the bottom electrode 211 and the binding electrode 24 may be made of the same material and formed by using the same patterning process.

It is to be noted that the bottom electrodes 211 of all the piezoelectric devices 21 in FIG. 28 may be patterned structures or may be a monolithic structure. The piezoelectric layers 213 of all the piezoelectric devices 21 are patterned structures. The top electrodes 212 of all the piezoelectric devices 21 are patterned structures corresponding to the piezoelectric layers 213.

During implementations, a material of the piezoelectric layers of the piezoelectric devices may be lead zirconate titanate ($Pb(Zr,Ti)O_3 \cdot PZT$), and may also be at least one of aluminum nitride (AlN), zinc oxide (ZnO), barium titanate ($BaTiO_3$), lead titanate ($PbTiO_3$), potassium niobate ($KNbO_3$), lithium niobate ($LiNbO_3$), lithium tantalate ($LiTaO_3$), and lanthanum gallium silicate ($La_3Ga_5SiO_{14}$). In particular the material of the piezoelectric layers may be selected according to actual usage needs of those skilled in the art, and is not limited herein. When the PZT is used to make the piezoelectric layer, since the PZT has a high pizoelectric coefficient, a piezoelectric characteristic of the corresponding vibration panel is guaranteed, and the corresponding vibration panel may be used in the haptic feedback device. The PZT has a high light transmittance, such that display quality of a display device is not influenced when the piezoelectric layer is integrated into the display device.

In an implementation process, the top electrodes and the bottom electrodes of the piezoelectric devices may be made of indium tin oxide (ITO), and may also be made of indium zinc oxide (IZO), one of titanium gold (Ti—Au) alloy, titanium aluminum titanium (Ti—Al—Ti) alloy, and titanium molybdenum (Ti—Mo) alloy, and one of titanium (Ti), gold (Au), silver (Ag), molybdenum (Mo), copper (Cu), tungsten (W), and chromium (Cr). The above electrodes may be arranged by those skilled in the art according to actual usage needs and are not limited herein.

During implementations, in the vibration panel provided in the embodiments of the present disclosure, as shown in FIGS. 9-27, the regulation structure 3 includes one or a combination of a support layer 31, a weight layer 32, and a regulation film layer 33. The one or a combination of the support layer 31, the weight layer 32, and the regulation film layer 33 are fixedly connected to the substrate 1. By arranging one or a combination of the support layer 31, the weight layer 32, and the regulation film layer 33 on the substrate 1, the characteristic frequency of the substrate 1 may be changed, such that the resonant frequency of the substrate 1 satisfies the sensitive frequency range of a tactile organ of a person, so as to effectively improve a haptic feedback effect of a haptic reproduction device based on the piezoelectric film excitation vibration in a low frequency range.

During implementations, in the vibration panel provided in the embodiments of the present disclosure, as shown in FIGS. 9-16, the support layer 31 and the piezoelectric sensor 2 are located on the same side of the substrate 1. For example, the resonant frequency and the resonant mode of the substrate 1 may be regulated by arranging support layers 31 having different modulus parameters on the substrate 1.

During implementations, in the vibration panel provided in the embodiments of the present disclosure, as shown in FIGS. 9-16, the support layer 31 includes first support portions 311 located in a peripheral area of the substrate 1 and arranged around the piezoelectric sensor 2. The support layer 31 mainly connects the substrate 1 and a support substrate (introduced later). Connection stiffness of the support layer 31 in a normal direction of the substrate 1 is mainly determined by an elastic modulus of the material of the support layer 31, a connection area and a thickness of the support layer 31. The characteristic frequency and the characteristic mode of the substrate 1 are regulated by varying the connection stiffness of the support layer 31. The material of the support layer 31 may be, but is not limited to, rubber, polyfoam, foam, poly dimethylsiloxane (PDMS), etc. By selecting materials having different elastic moduli, the connection stiffness of the support layer 31 is varied, and the larger the connection stiffness is, the higher the characteristic frequency of the substrate 1 is. The elastic modulus of the material of the support layer 31, the connection area and the thickness of the support layer 31 are selected according to the actual needs (actual required characteristic frequency of the substrate 1) to regulate the characteristic frequency and the resonant mode of the substrate, such that the resonant frequency of the substrate 1 falls within the sensitive frequency range (400 Hz-600 Hz) of a tactile organ of a person, so as to improve the haptic feedback effect of the haptic reproduction device based on piezoelectric film excitation vibrations in the low frequency range.

For example, an adhesive layer (for example, optical clear adhesive. OCA), etc. may be used for fixed connection between the support layer and the substrate.

During implementations, in the vibration panel provided in the embodiments of the present disclosure, as shown in FIGS. 9, 10, 12, and 13, a plurality of first support portions 311 may be provided. When the material and thickness of the support layer 31 are determined, the connection stiffness in the normal direction of the substrate 1 is mainly determined by the connection area of the support layer 31, the larger the area is, the larger the connection stiffness is and the higher the characteristic frequency of the substrate 1 is.

Figure 9:
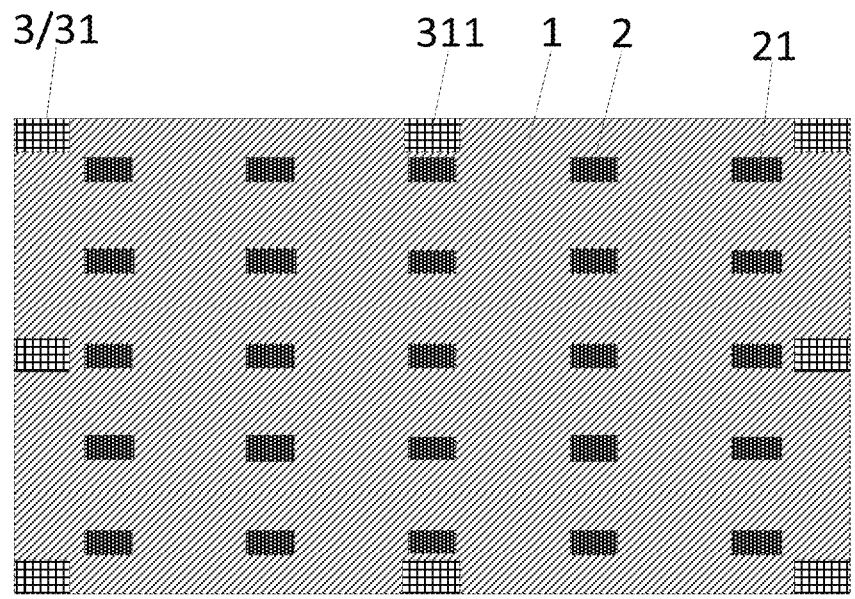
FIGS. 9-14 are schematic top views of vibration panels.
Figure 12:
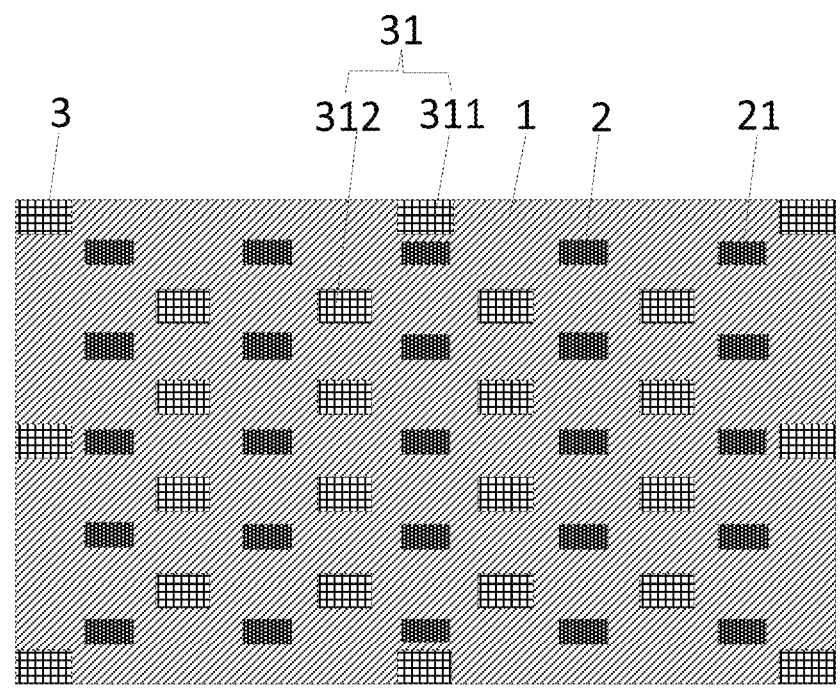

During implementations, in the vibration panel provided in the embodiments of the present disclosure, as shown in FIGS. 9 and 12, the shape of an orthographic projection of each of the first support portions 311 on the substrate 1 may include a rectangle. Certainly, the shape of the orthographic projection of each of the first support portions 311 on the substrate 1 may further include a triangle, a circle, a trapezoid, or a polygon.

Figure 10:
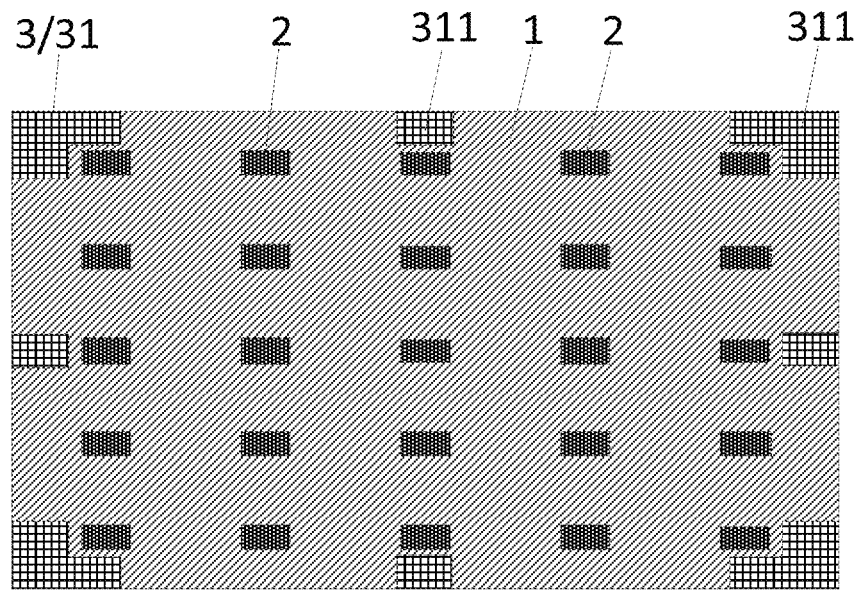
Figure 13:
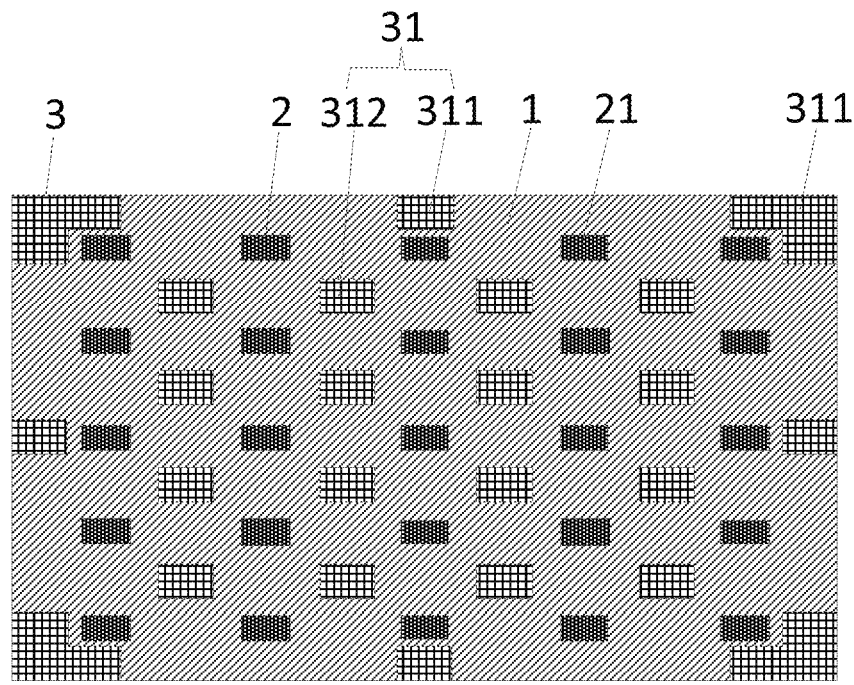

During implementations, in the vibration panel provided in the embodiments of the present disclosure, as shown in FIGS. 10 and 13, the shape of the orthographic projection of each of the first support portions 311 at four corners of the substrate 1 on the substrate 1 is an L shape, and the shape of the orthographic projection of each of the remaining first support portions 311 on the substrate 1 may include a rectangle. Certainly, the shape of the orthographic projection of each of the first support portions 311 on the substrate 1 may further include a triangle, a circle, a trapezoid, or a polygon.

Figure 11:
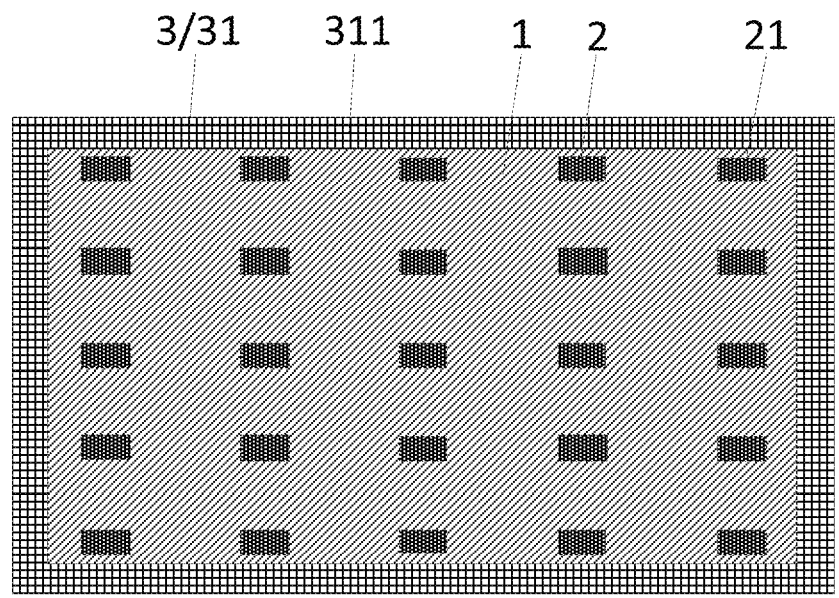
Figure 14:
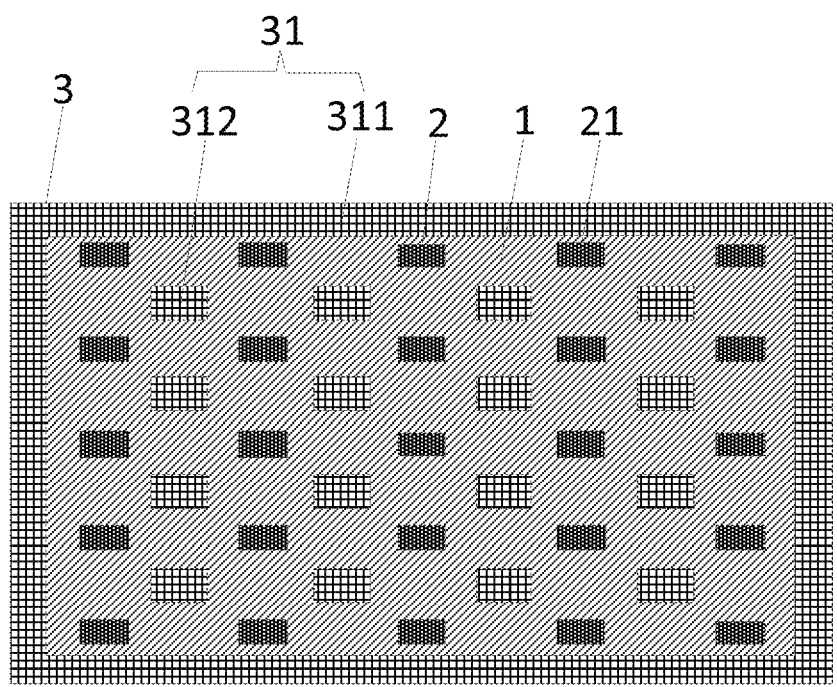
Figure 15:
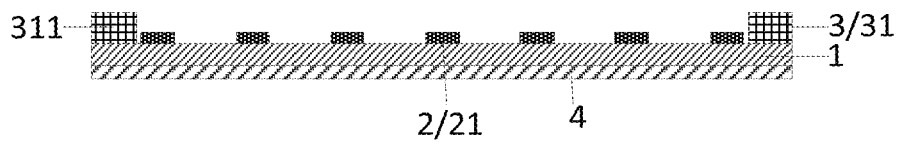
FIG. 15 is a schematic sectional view of FIGS. 9-11.

During implementations, in the vibration panel provided in the embodiments of the present disclosure, as shown in FIGS. 11 and 14, the first support portions 311 may be of a closed annular structure arranged around the piezoelectric sensor 2.

During implementations, in the vibration panel provided in the embodiments of the present disclosure, as shown in FIGS. 12-14, the piezoelectric sensor 2 includes a plurality of piezoelectric devices 21 distributed in an array. The support layer 31 further includes second support portions 312 at gaps between the adjacent piezoelectric devices 21. That is, the second support portions 312 may be distributed in the substrate 1. For instance, in the embodiments of the present disclosure, the second support portions 312 are evenly distributed in the substrate 1. Certainly: the second support portions 312 may be distributed in a local area. By varying distribution of the second support portions 312 in the substrate 1, the connection stiffness of the support layer 31 may be varied. When the material and thickness of the support layer 31 are determined, the connection stiffness in the normal direction of the substrate 1 is mainly determined by the connection area of the support layer 31, the larger the area is, the larger the connection stiffness is and the higher the characteristic frequency of the substrate 1 is. After the material and thickness of the support layer 31 are determined, the characteristic mode of the substrate 1 may be regulated by varying the distribution of the second support portions 312 at positions in the substrate 1.

During implementations, in the vibration panel provided in the embodiments of the present disclosure, as shown in FIGS. 12-14, the shape of an orthographic projection of each of the second support portions 312 on the substrate 1 may include a rectangle. Certainly: the shape of the orthographic projection of each of the second support portions 312 on the substrate 1 may further include a triangle, a circle, a trapezoid, or a polygon.

During implementations, in the vibration panel provided in the embodiments of the present disclosure, as shown in FIGS. 12-14, a plurality of second support portions 312 are provided between every two adjacent columns of piezoelectric devices 21. The second support portion 312 is provided at a central position of every two adjacent rows and two adjacent columns of piezoelectric devices 21. Certainly, the distribution condition of the second support portions 312 may be determined according to the characteristic frequency of the substrate 1 as actually desired. For example, the second support portions 312 are evenly distributed on the entire substrate 1, or the second support portions 312 are distributed in a local area of the substrate 1.

Figure 16:
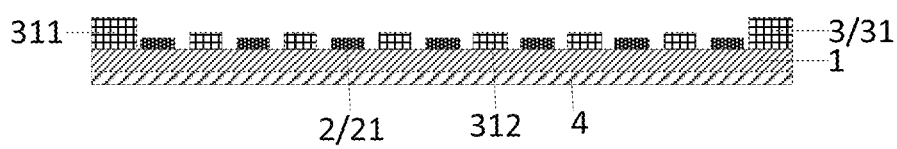
FIG. 16 is a schematic sectional view of FIGS. 12-14.

During implementations, in the vibration panel provided in the embodiments of the present disclosure, as shown in FIGS. 15 and 16, the support layer 31 is a connection structure having a certain thickness. When the material of the support layer 31 and the connection area to the substrate 1 are determined, the connection stiffness in the normal direction of the substrate 1 is mainly determined by the thickness of the support layer 31, the smaller the thickness is, the larger the stiffness is and the higher the characteristic frequency of the substrate 1 is. The thickness of the support layer 31 is designed according to the characteristic frequency of the substrate 1 as actually desired.

Figure 30:
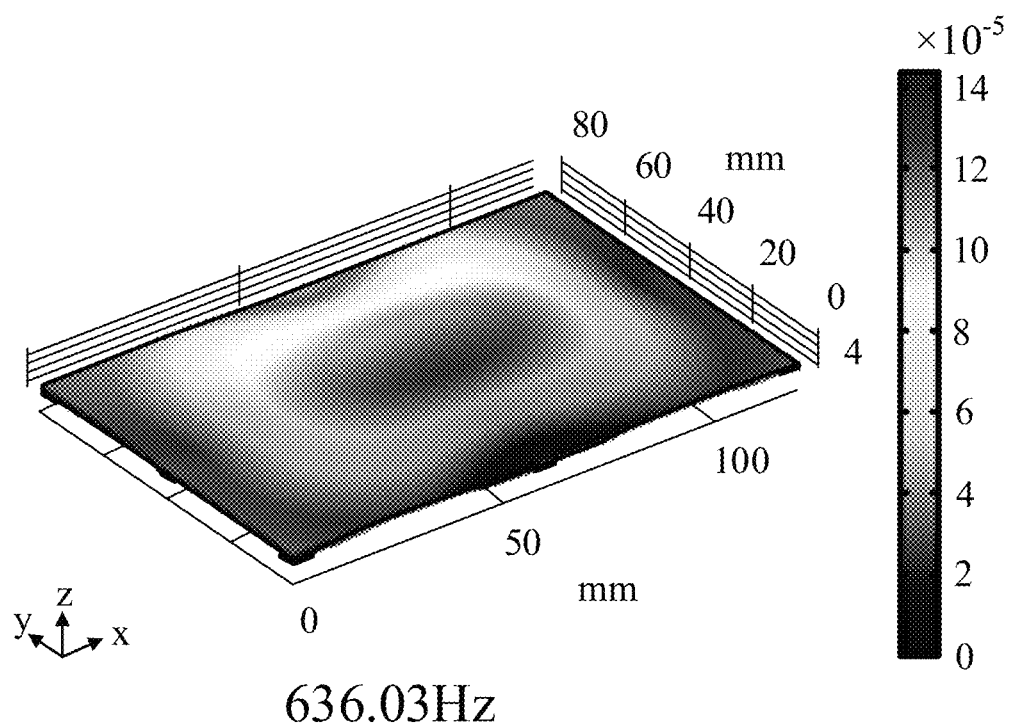
FIG. 30 is a characteristic mode corresponding to a characteristic frequency of 636.03 Hz of a substrate provided with a support layer.
Figure 31:
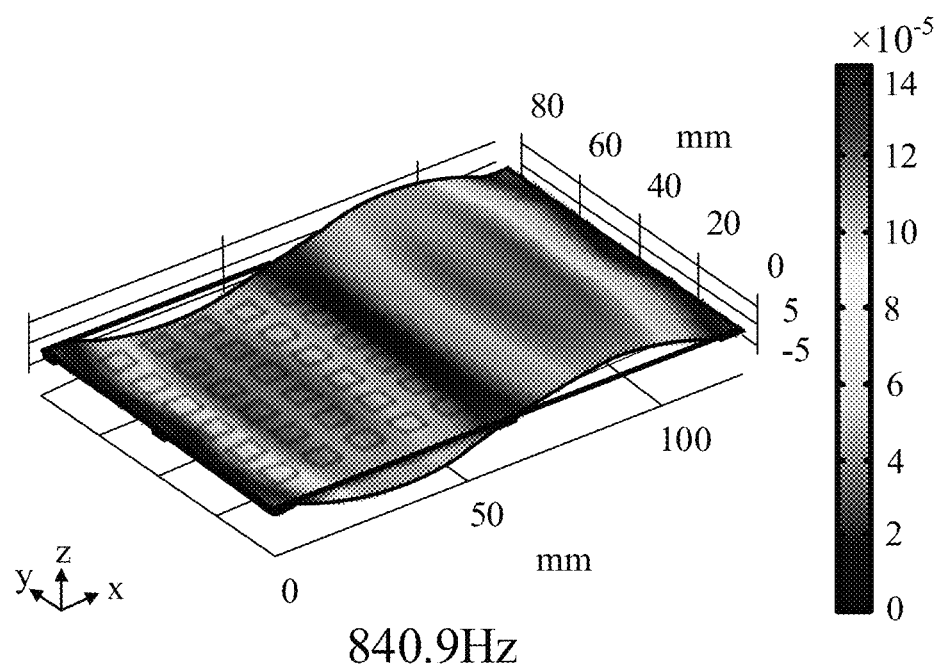
FIG. 31 is a characteristic mode corresponding to a characteristic frequency of 840.9 Hz of a substrate provided with a support layer.
Figure 32:
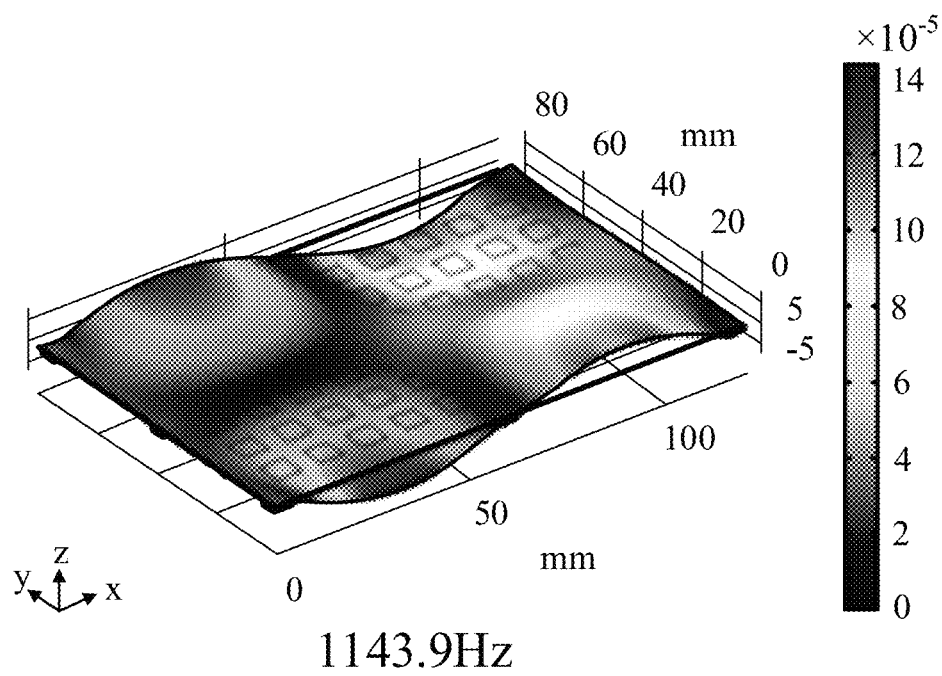
FIG. 32 is a characteristic mode corresponding to a characteristic frequency of 1143.9 Hz of a substrate provided with a support layer.
Figure 33:
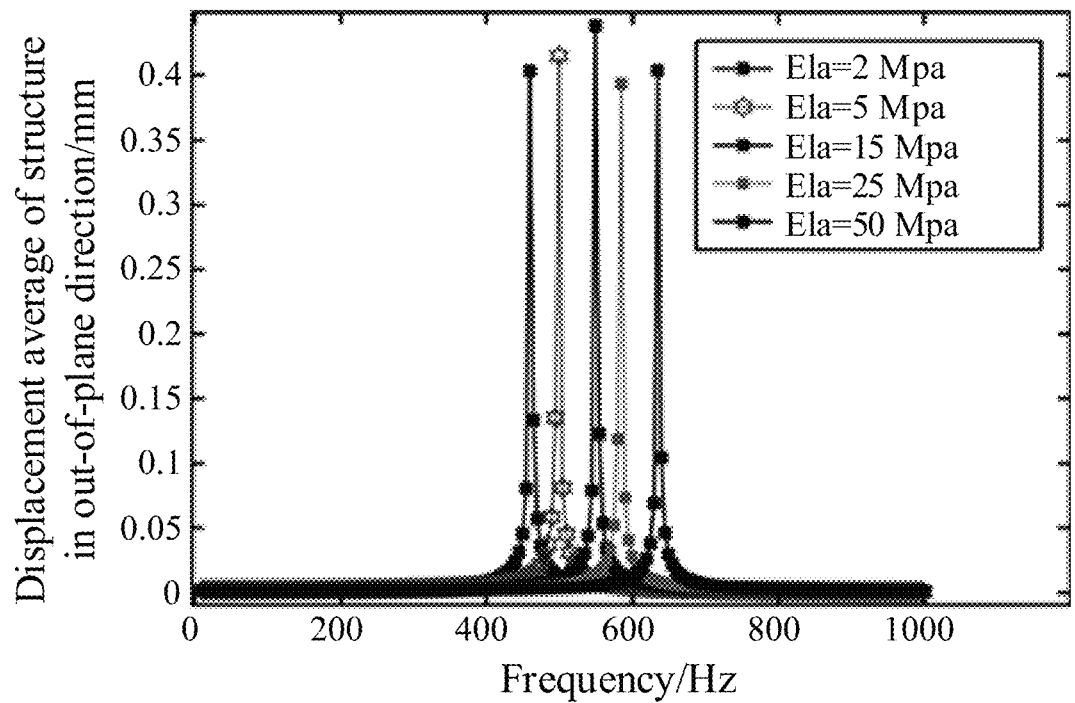
FIG. 33 illustrates corresponding frequency response curves of a substrate under excitation in particular frequency ranges when a support layer uses rubber having a modulus (Ela) of 2 Mpa. 5 Mpa. 15 Mpa. 25 Mpa or 50 Mpa respectively.

As shown in FIGS. 30-32. FIGS. 30-32 illustrate several displacement distributions (characteristic modes) calculated in the frequency domain corresponding to characteristic frequencies of a substrate 1 provided in the embodiments of the present disclosure within 1200 Hz respectively, where a support layer 31 is arranged on the substrate 1. FIG. 30 is a characteristic mode corresponding to a characteristic frequency of 636.03 Hz of a substrate 1 provided with a support layer 31. FIG. 31 is a characteristic mode corresponding to a characteristic frequency of 840.9 Hz of a substrate 1 provided with a support layer 31. FIG. 32 is a characteristic mode corresponding to a characteristic frequency of 1143.9 Hz of a substrate 1 provided with a support layer 31. Compared with FIGS. 2-8, the characteristic frequency of the substrate 1 may be varied by arranging the support layer 31 on the substrate 1 in the embodiments of the present disclosure. As shown in FIG. 33. FIG. 33 illustrates corresponding frequency response curves (displacement average of structure in out-of-plane direction-resonant frequency) of a substrate 1 under excitation in particular frequency ranges when a support layer 31 uses rubber having a modulus (Ela) of 2 mPa, 5 mPa, 15 mPa, 25 mPa or 50 mPa respectively. It can be seen that by varying the modulus of the material of the support layer 31, the characteristic frequency of the substrate 1 may be varied, so as to vary the resonant frequency of the substrate 1. The rubber having a modulus of 2 mPa corresponds to a resonant frequency of the substrate 1 being 460 Hz, the rubber having a modulus of 5 mPa corresponds to a resonant frequency of the substrate 1 being 500 Hz, the rubber having a modulus of 15 mPa corresponds to a resonant frequency of the substrate 1 being 550 Hz, the rubber having a modulus of 25 mPa corresponds to a resonant frequency of the substrate 1 being 585 Hz, and the rubber having a modulus of 50 mPa corresponds to a resonant frequency of the substrate 1 being 635 Hz, such that the resonant frequency of the substrate 1 falls within the sensitive frequency range (400 Hz-600 Hz) of a tactile organ of a person, so as to improve the haptic feedback effect of the haptic reproduction device based on piezoelectric film excitation vibration in the low frequency range.

Figure 34:
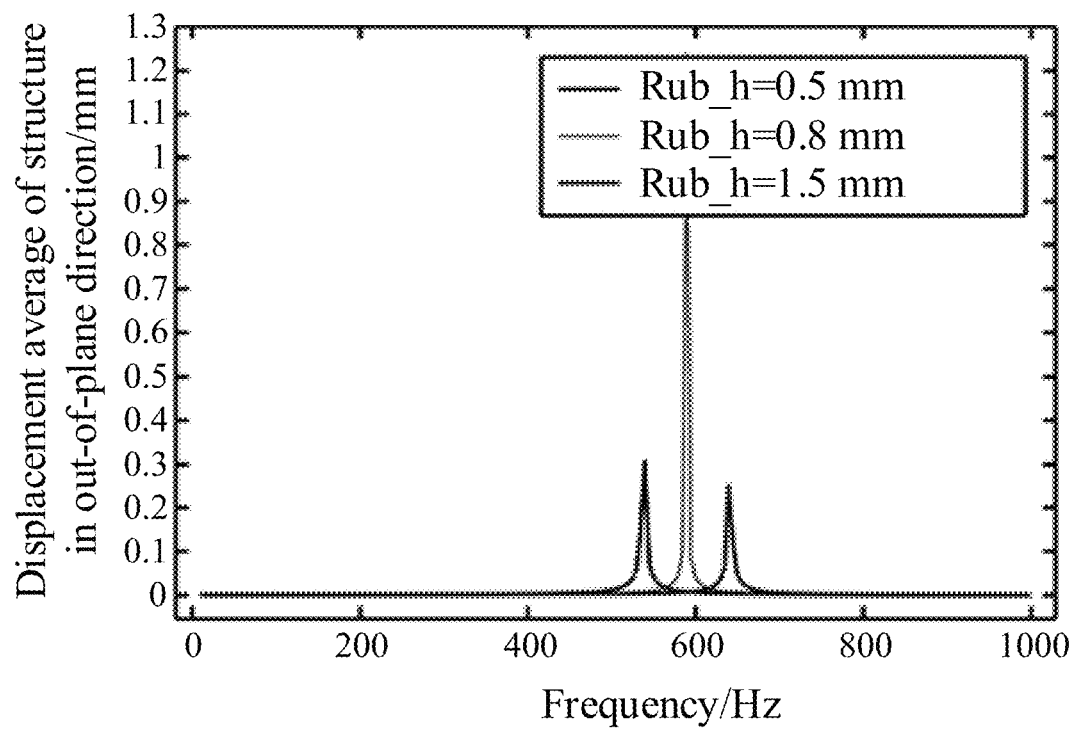
FIG. 34 illustrates corresponding frequency response curves of a substrate under excitation in particular frequency ranges when a support layer uses rubber having different thicknesses Rub_h (0.5 mm. 0.8 mm, and 1.5 mm) respectively.

As shown in FIG. 34. FIG. 34 illustrates corresponding frequency response curves (displacement average of structure in out-of-plane direction-resonant frequency) of a substrate 1 under excitation in particular frequency ranges when a support layer 31 uses rubber having different thicknesses Rub_h (0.5 mm. 0.8 mm, and 1.5 mm) respectively. It can be seen that by varying the thickness of the material of the support layer 31, the characteristic frequency of the substrate 1 may be varied, so as to vary the resonant frequency of the substrate 1. The rubber having a thickness of 0.5 mm corresponds to a resonant frequency of the substrate 1 being 540 Hz, the rubber having a thickness of 0.8 mm corresponds to a resonant frequency of the substrate 1 being 590 Hz, and the rubber having a thickness of 1.5 mm corresponds to a resonant frequency of the substrate 1 being 640 Hz, such that the resonant frequency of the substrate 1 falls within the sensitive frequency range (400 Hz-600 Hz) of a tactile organ of a person, so as to improve the haptic feedback effect of the haptic reproduction device based on piezoelectric film excitation vibration in the low frequency range.

During implementations, in the vibration panel provided in the embodiments of the present disclosure, as shown in FIGS. 17-23. FIGS. 17-22 illustrate structures arranged based on the structures of FIGS. 9-14 respectively. The weight layer 32 and the piezoelectric sensor 2 are located on the same side of the substrate 1. The resonant frequency and the resonant mode of the substrate 1 may be regulated by arranging weight layers 32 having different number and different masses on the substrate 1.

Embodiments of the present disclosure is exemplified by the weight layer 32 and piezoelectric sensor 2 being located on the same side of the substrate 1. Certainly, the weight layer 32 may also be located on a side of the substrate 1 facing away from the piezoelectric sensor 2. However, since the side of the substrate 1 facing away from the piezoelectric sensor 2 is generally provided with other film layers, embodiments of the present disclosure prefer that the weight layer 32 and the piezoelectric sensor 2 are located on the same side of the substrate 1.

During implementations, in the vibration panel provided in the embodiments of the present disclosure, as shown in FIGS. 17-23, the piezoelectric sensor 2 includes a plurality of piezoelectric devices 21 distributed in an array. The weight layer 32 includes mass blocks 321 located at gaps between the adjacent piezoelectric devices 21. The material of the mass blocks 321 may be the same material as the substrate 1 or may be another material different from the substrate 1. By selecting different density of the materials of the mass blocks 321, the entire mass of the substrate 1 is varied, the larger the entire mass is, the lower the characteristic frequency of the substrate 1 is.

In an implementation process, the substrate in the embodiments of the present disclosure may be a substrate made of glass, may further be a substrate made of silicon or silicon dioxide ($SiO_2$), a substrate made of sapphire, or a substrate made of metal wafer, and is not limited herein, and those skilled in the art may arrange the substrate according to actual usage needs.

During implementations, in the vibration panel provided in the embodiments of the present disclosure, as shown in FIGS. 17-23, a plurality of mass blocks 321 are provided between every two adjacent columns of piezoelectric devices 21, and the mass block 321 is provided at a central position of every two adjacent rows and two adjacent columns of piezoelectric devices 21. Certainly, the distribution condition of the mass blocks 321 may be determined according to the characteristic frequency of the substrate 1 as actually desired. For example, the mass blocks 321 are evenly distributed on the entire substrate 1, or the mass blocks 321 are distributed in a local area of the substrate 1.

Figure 17:
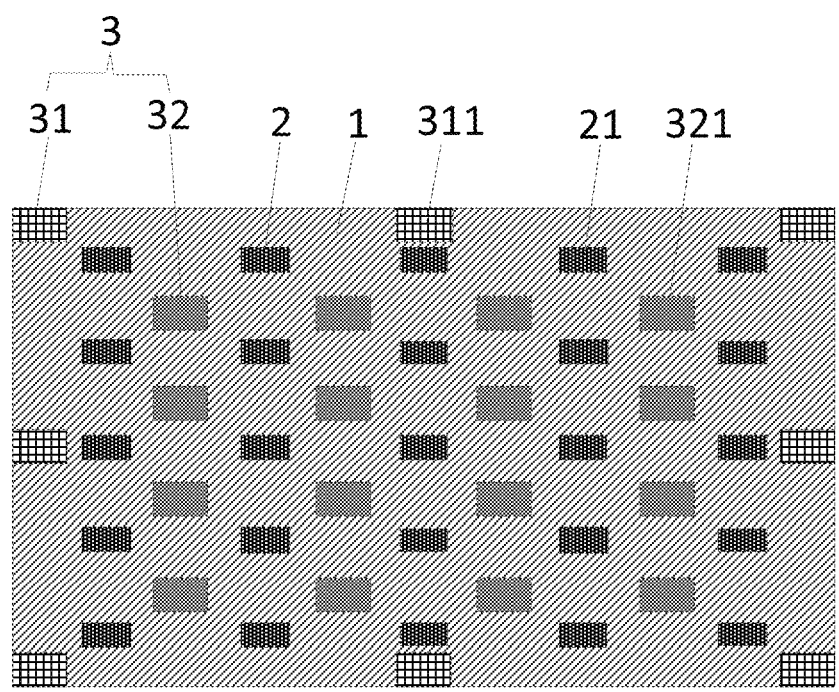
FIGS. 17-22 are schematic top views of vibration panels.
Figure 18:
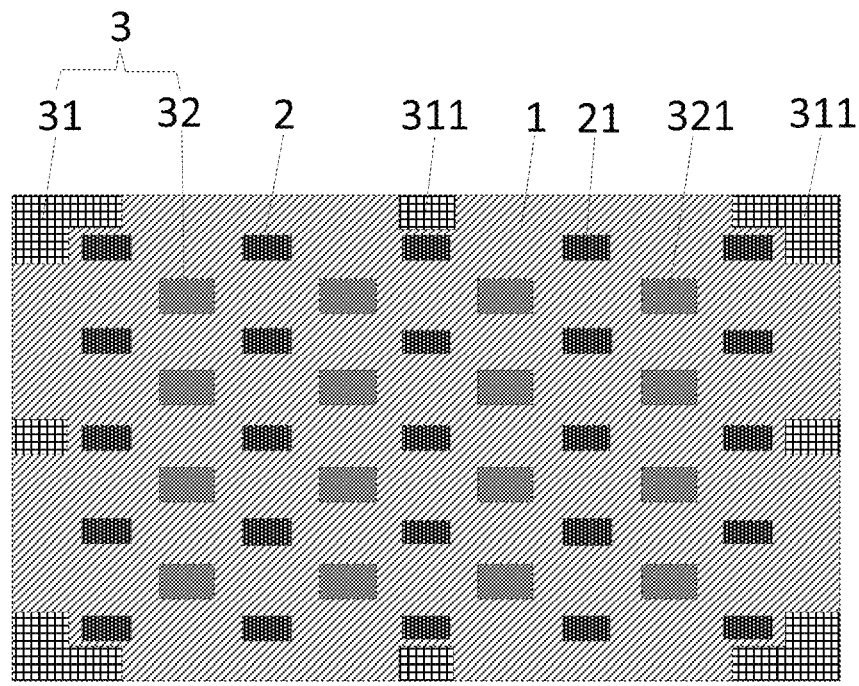
Figure 19:
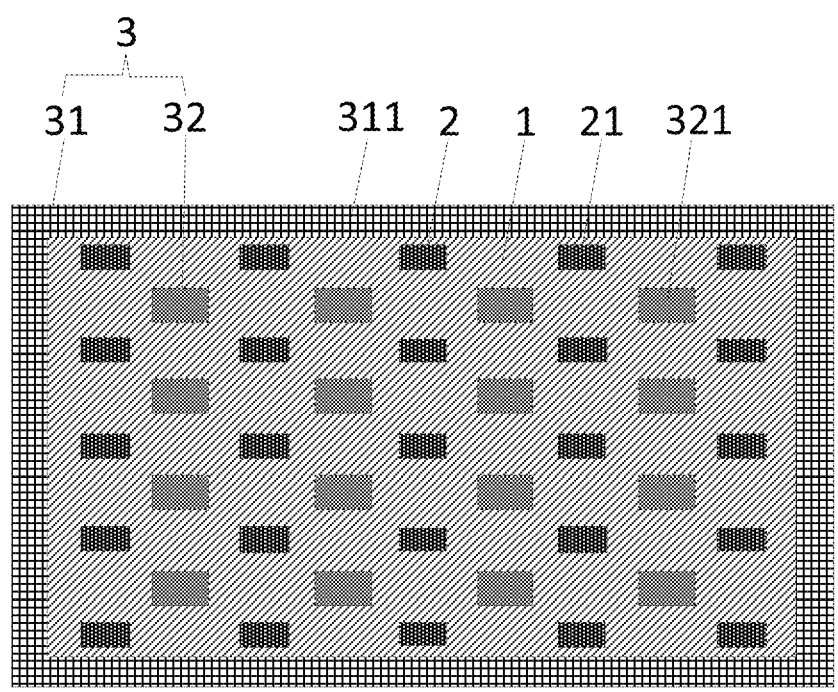
Figure 20:
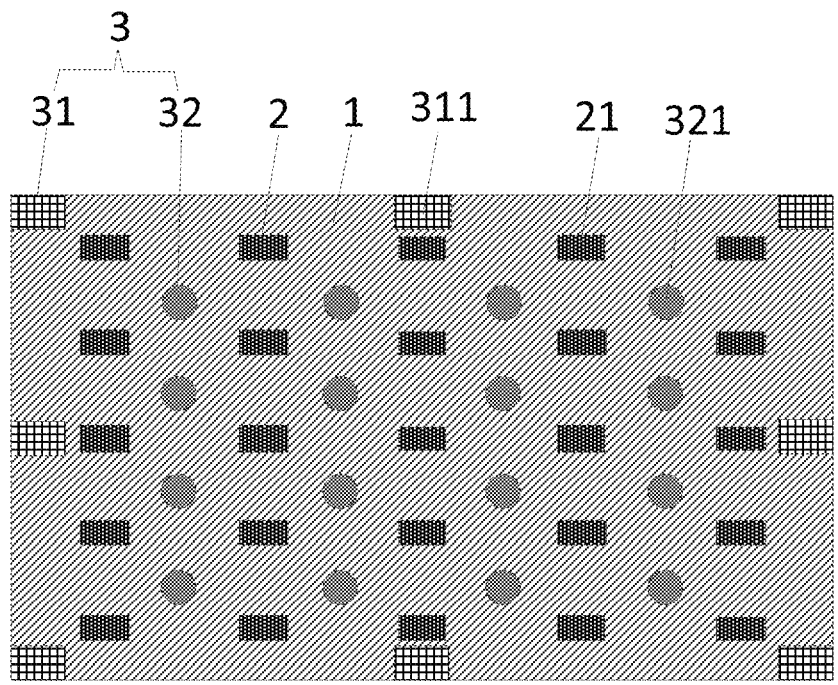

During implementations, in the vibration panel provided in the embodiments of the present disclosure, the shape of an orthographic projection of each of the mass blocks on the substrate 1 includes at least one of a rectangle, a circle, and a polygon. For example, as shown in FIGS. 17-19, the shape of the orthographic projection of each of the mass blocks 321 on the substrate 1 is a rectangle. As shown in FIGS. 20-22, the shape of the orthographic projection of each of the mass blocks 321 on the substrate 1 is a circle.

As shown in FIGS. 17-23, the size of the mass blocks 321 is determined by the sections and heights of the mass blocks 321. The entire mass of the substrate 1 is varied by varying the size of the mass blocks 321, the larger the entire mass is, the lower the characteristic frequency of the substrate 1 is, and the mass of the mass blocks 321 is designed according to the characteristic frequency of the substrate 1 actually desired.

As shown in FIGS. 17-23, the mass blocks 321 may be distributed anywhere in the substrate 1, the characteristic frequency of the substrate 1 may be regulated by varying the distribution of the mass blocks 321. Under the condition that the total mass of the mass blocks 321 is determined, the more the mass blocks 321 are concentrated in a middle area of the substrate 1, the lower the characteristic frequency of the substrate 1 is, and the distribution of the mass blocks 321 is designed according to the characteristic frequency of the substrate 1 actually desired.

Figure 35:
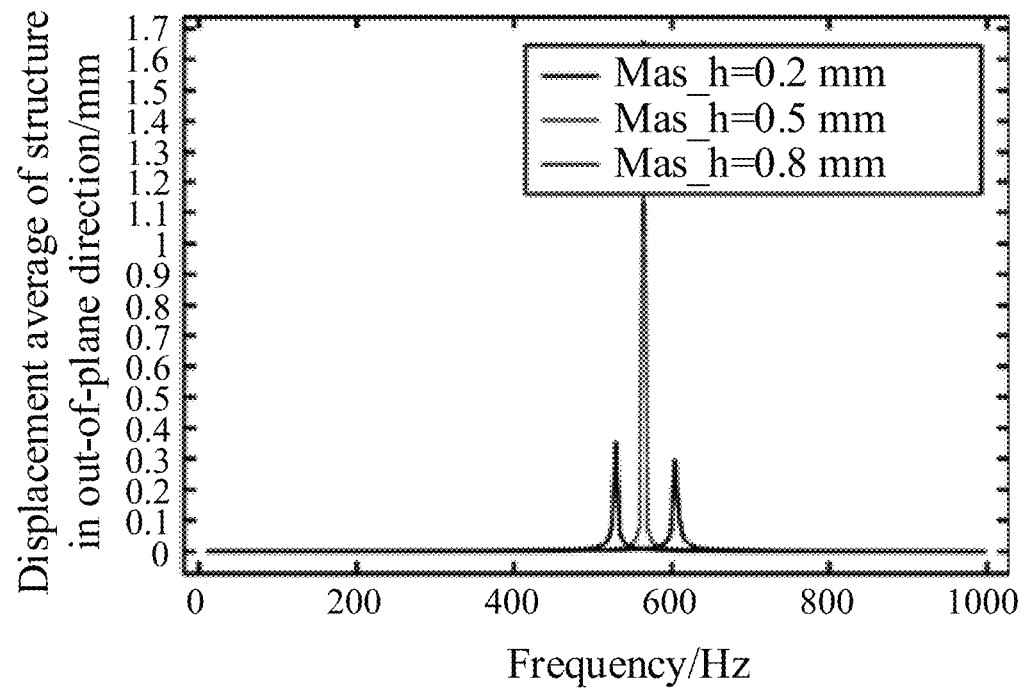
FIG. 35 illustrates corresponding frequency response curves of a substrate under excitation in particular frequency ranges when a weight layer uses mass blocks having different thicknesses Mas_h (0.2 mm. 0.5 mm, and 0.8 mm) respectively.

As shown in FIG. 35. FIG. 35 shows corresponding frequency response curves (displacement average of structure in out-of-plane direction-resonant frequency) of a substrate 1 under excitation in particular frequency ranges when a weight layer 32 uses mass blocks 321 having different thicknesses Mas_h (0.2 mm. 0.5 mm, and 0.8 mm) respectively. It can be seen that by varying the thickness of the mass blocks 321, the characteristic frequency of the substrate 1 may be varied, so as to vary the resonant frequency of the substrate 1. The mass blocks 321 having a thickness of 0.2 mm corresponds to a resonant frequency of the substrate 1 being 530 Hz, the mass blocks 321 having a thickness of 0.5 mm corresponds to a resonant frequency of the substrate 1 being 565 Hz, and the mass block 321 having a thickness of 0.8 mm corresponds to a resonant frequency of the substrate 1 being 605 Hz, such that the resonant frequency of the substrate 1 falls within the sensitive frequency range (400 Hz-600 Hz) of a tactile organ of a person, so as to improve the haptic feedback effect of the haptic reproduction device based on piezoelectric film excitation vibration in the low frequency range.

Figure 24:
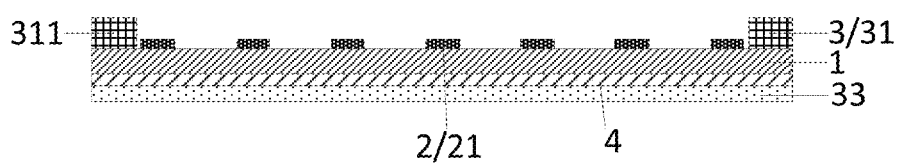
FIGS. 24-27 are several other schematic sectional views of vibration panels.
Figure 25:
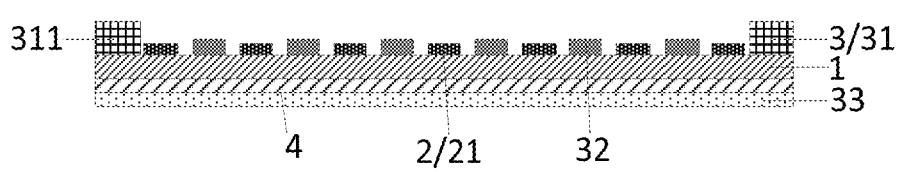

During implementations, in the vibration panel provided in the embodiments of the present disclosure, as shown in FIGS. 24 and 25, the regulation film layer 33 is located on a side of the substrate 1 facing away from the piezoelectric sensor 2. The resonant frequency and the resonant mode of the substrate 1 may be regulated by arranging the regulation film layer 33 on the substrate 1. By arranging the regulation film layer 33 on the substrate 1, a haptic feedback effect of a haptic reproduction device based on the piezoelectric film excitation vibration in a low frequency range may be effectively improved.

Embodiments of the present disclosure are exemplified by the regulation film layer 33 being located on the side of the substrate 1 facing away from the piezoelectric sensor 2. Certainly, the regulation film layer 33 may also be located on a side of the piezoelectric sensor 2 facing away from the substrate 1. However, when the regulation film layer 33 is arranged above the piezoelectric sensor 2, the risk of damage to the piezoelectric sensor 2 may exist, thus the embodiments of the present disclosure preferably arrange the regulation film layer 33 on a side of the substrate 1 facing away from the piezoelectric sensor 2.

During implementations, in the vibration panel provided in the embodiments of the present disclosure, as shown in FIGS. 15, 16, and 23-27, the vibration panel further includes a touch layer 4 located on a side of the substrate 1 facing away from the piezoelectric sensor 2. By using an integrated structure of the substrate 1 and the touch layer 4, a touch function (for example, a function of determining a touch location) and a haptic reproduction function may be implemented.

Figure 26:
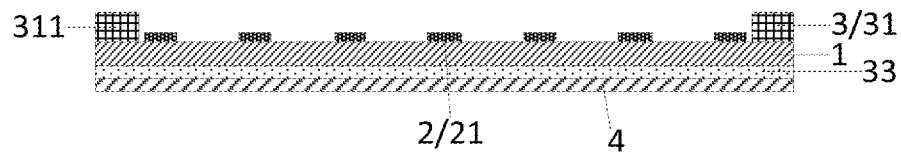
Figure 27:
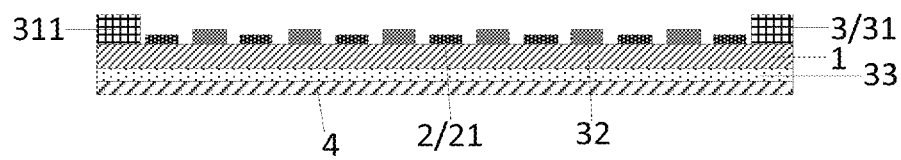

During implementations, in the vibration panel provided in the embodiments of the present disclosure, as shown in FIGS. 24 and 25, the regulation film layer 33 is located on a side of the touch layer 4 facing away from the substrate 1, or as shown in FIGS. 26 and 27, the regulation film layer 33 is located between the substrate 1 and the touch layer 4. The regulation film layer 33 mainly regulates the characteristic frequency and the characteristic mode of the substrate 1 by comprehensively varying the entire mass and stiffness of the substrate 1. The mass of the regulation film layer 33 is determined by a thickness of the regulation film layer 33 and density of the film layer. The stiffness of the regulation film layer 33 is determined by the thickness of the film layer and an elastic modulus of a material of the film layer. When an effect of the regulation film layer 33 on the entire mass increase in the substrate 1 exceeds an effect of the stiffness increase, the characteristic frequency of the substrate 1 decreases. When the effect of the regulation film layer 33 on the entire stiffness increase in the substrate 1 exceeds the effect of the mass increase, the characteristic frequency of the substrate 1 increases.

During implementations, in the vibration panel provided in the embodiments of the present disclosure, as shown in FIGS. 24-27, a material of the regulation film layer 33 includes but not limited to polyethylene terephthalate (PET), polymethyl methacrylate (PMMA) or polyimide (PI). By selecting the material of the regulation film layer 33, the entire stiffness and entire mass of the film layer 33 are regulated, and then the characteristic frequency of the substrate 1 is varied, such that the resonant frequency of the substrate 1 falls within the sensitive frequency range (400 Hz-600 Hz) of a tactile organ of a person, so as to improve a haptic feedback effect of a haptic reproduction device based on the piezoelectric film excitation vibration in a low frequency range.

During implementations, in the vibration panel provided in the embodiments of the present disclosure, as shown in FIGS. 24-27, the substrate 1 has a thickness of 0.3 mm-0.8 mm. The present disclosure may also regulate the characteristic frequency of the substrate 1 by varying the thickness of the substrate 1. For example, the characteristic frequency of the substrate 1 may be regulated by varying the thickness of the substrate 1 on the basis of a vibration panel in the related art. The characteristic frequency of the substrate 1 may also be regulated by varying the thickness of the substrate 1 on the basis of a solution provided with one or a combination of a support layer, a weight layer, a regulation film layer, and then the resonant frequency of the substrate 1 satisfies the sensitive frequency range (400 Hz-600 Hz) of a tactile organ of a person, so as to improve a haptic feedback effect of a haptic reproduction device based on the piezoelectric film excitation vibration in a low frequency range.

Figure 36:
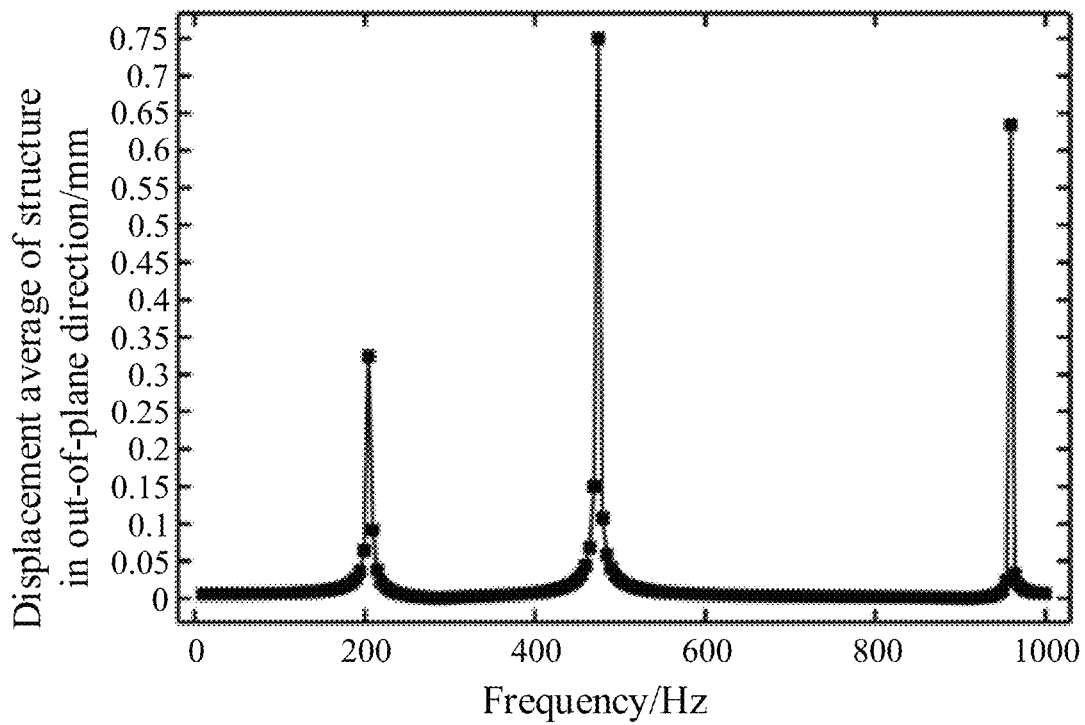
FIG. 36 illustrates corresponding frequency response curves of a substrate under excitation in particular frequency ranges when the substrate has different thicknesses (0.3 mm. 0.5 mm, and 0.8 mm) respectively.
Figure 37:
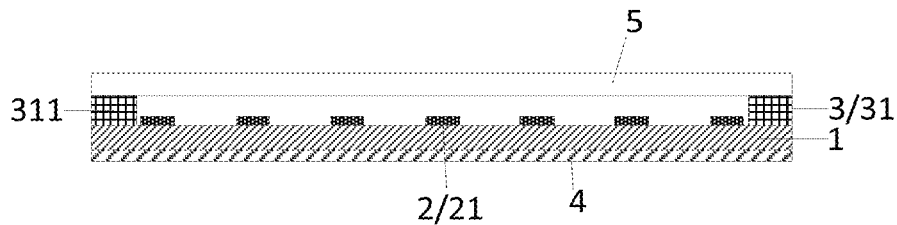
FIGS. 37-43 are schematic structural diagrams of haptic feedback devices according to embodiments of the present disclosure.
Figure 38:
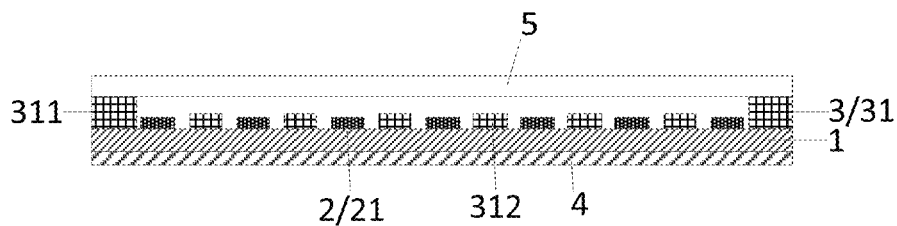
Figure 39:
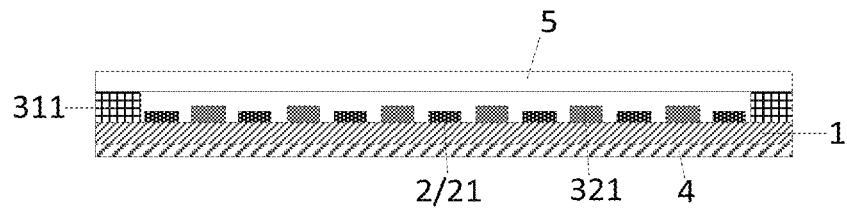
Figure 40:
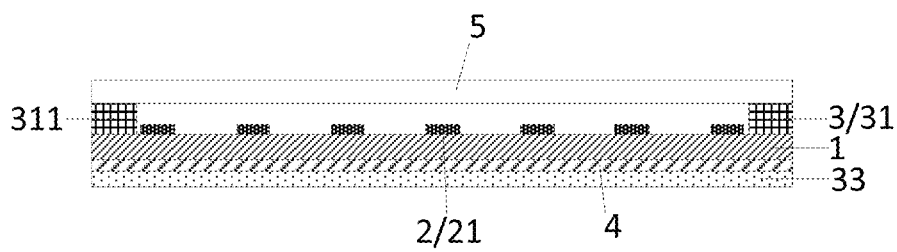
Figure 41:
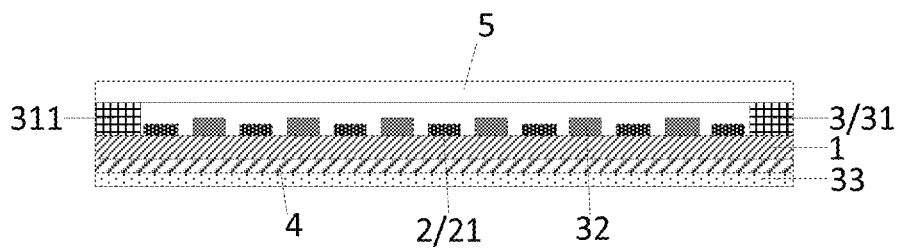
Figure 42:
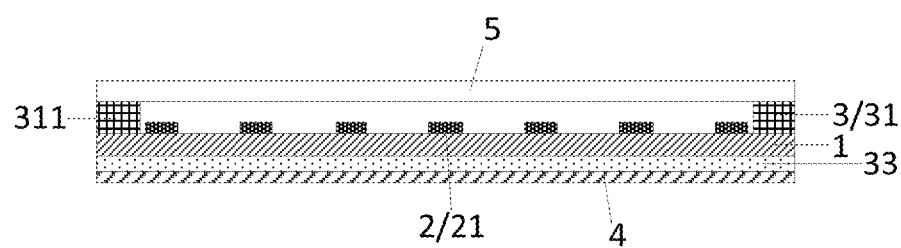
Figure 43:
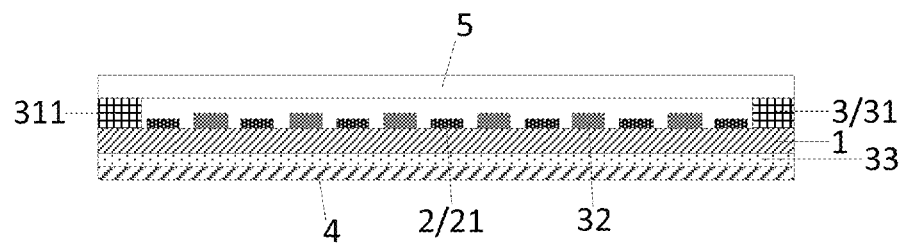

As shown in FIG. 36. FIG. 36 illustrates corresponding frequency response curves (displacement average of structure in out-of-plane direction-resonant frequency) of a substrate 1 under excitation in particular frequency ranges when the substrate 1 has different thicknesses (0.3 mm. 0.5 mm, and 0.8 mm) respectively. It can be seen that by varying the thickness of the substrate 1, the characteristic frequency of the substrate 1 may be varied, so as to vary the resonant frequency and the resonant mode of the substrate 1. The substrate 1 having a thickness of 0.3 mm has a resonant frequency of 605 Hz, the substrate 1 having a thickness of 0.5 mm has a resonant frequency of 475 Hz, and the substrate 1 having a thickness of 0.8 mm has a resonant frequency of 960 Hz, such that the resonant frequency of the substrate 1 falls within the sensitive frequency range (400 Hz-600 Hz) of a tactile organ of a person, so as to improve the haptic feedback effect of the haptic reproduction device based on piezoelectric film excitation vibration in the low frequency range.

It is to be noted that in the embodiments of the present disclosure, the characteristic frequency of the substrate 1 may be varied accordingly when the thickness of the substrate 1 is regulated in a range of 0.3 mm-0.8 mm when the dimension of the substrate 1 is 120 mm×80 mm, such that the resonant frequency of the substrate 1 falls within the sensitive frequency range of a tactile organ of a person. Certainly, when the dimension of the substrate 1 are other dimensions, the thickness range of the substrate 1 may be varied accordingly, such that the resonant frequency of the substrate 1 falls within the sensitive frequency range of a tactile organ of a person.

Certainly, besides the various film layers mentioned above, the vibration panel may further be provided with other film layers according to the actual application.

In summary: by means of any one solution or any superposition between the following four solutions, embodiments of the present disclosure may make a resonant frequency of the substrate fall within the sensitive frequency range (400 Hz-600 Hz) of a tactile organ of a person. The solutions are: (1) an entire stiffness of a structure is varied by adding a support layer on a substrate, so as to regulate a characteristic frequency and a characteristic mode of the substrate; (2) entire mass and mass distribution of the structure are varied by adding a mass block on the substrate, so as to regulate the characteristic frequency and the characteristic mode of the substrate; (3) the entire stiffness and mass of the structure are varied by arranging a regulation film layer on the substrate, so as to regulate the characteristic frequency and the characteristic mode of the substrate; and (4) the entire stiffness and mass of the structure are varied by varying a thickness of the substrate, so as to regulate the characteristic frequency and the characteristic mode of the substrate.

The embodiments of the present disclosure provide a vibration panel, that may be used in the fields of medicine, automotive electronics, motion tracking systems, etc., and is particularly suitable for the field of wearable apparatuses, medical extracorporeal or human body implanting monitoring and therapeutic use, or in the field of electronic skin for artificial intelligence. For example, the vibration panel may be used in brake pads, keyboards, mobile terminals, gamepads, vehicles, smart homes, etc. that may generate vibration and mechanical characteristics.

Based on the same inventive concept, embodiments of the present disclosure further provide a drive method for driving the above vibration panel. The drive method includes:

vary a parameter of a regulation structure, to regulate a characteristic frequency of a substrate, so as to make a resonant frequency of the substrate satisfy a preset range; and load an excitation signal onto a piezoelectric sensor, where the piezoelectric sensor deforms to drive the substrate to vibrate.

During implementations, in the drive method provided in the embodiments of the present disclosure, the step of varying a parameter of a regulation structure includes at least one of:

regulate a thickness of the substrate, regulate connection stiffness of a support layer, regulate mass and a distribution position of a weight layer, and regulate stiffness and mass of the regulation film layer.

Reference may be made to the method, in the foregoing vibration panel, of varying a characteristic frequency of the substrate by regulating a thickness of the substrate, regulating connection stiffness of a support layer, regulating mass and a distribution position of a weight layer, and regulating stiffness and mass of the regulation film layer for implementation of the above drive method provided in the embodiments of the present disclosure.

Based on the same inventive concept, embodiments of the present disclosure further provide a haptic feedback device. As shown in FIGS. 37-43, the haptic feedback device includes the vibration panel provided in the embodiments of the present disclosure. Since a principle for solving problems of the haptic feedback device is similar to that of the foregoing vibration panel, reference may be made to the implementation of the foregoing vibration panel for the implementation of the haptic feedback device, and similarities will not be repeated herein. The haptic feedback device may be any product or part with a display or touch function, for example, a mobile phone, a tablet personal computer, a television, a display, a notebook computer, a digital photo frame, a navigator, etc.

During implementations, in the haptic feedback device provided in the embodiments of the present disclosure, as shown in FIGS. 37-43, the haptic feedback device further includes a support substrate 5 located on a side of the piezoelectric sensor 2 facing away from the substrate 1. The support substrate 5 may be a support frame or a support plate. The support substrate 5 mainly supports a haptic feedback device system, and may be a frame of a display screen, a frame of a notebook touchpad, etc.

During implementations, in the haptic feedback device provided in the embodiments of the present disclosure, as shown in FIGS. 37-43, when the support substrate 5 is the support plate and when a regulation structure 3 includes both a support layer 31 and a weight layer 32, the support layer 31 has a height greater than the weight layer 32, so as to achieve fixed connection between the support layer 31 and the support substrate 5.

For example, an adhesive layer (for example, optical clear adhesive, OCA), etc. may be used for fixed connection between the support substrate 5 and the support layer 31.

During implementations, the haptic feedback device provided in the embodiments of the present disclosure may further include other film layers well known to those skilled in the art and not described in detail herein.

During implementations, a position of touch of a human body may be determined by means of the haptic feedback device, to generate a corresponding vibration waveform, amplitude and frequency, so as to achieve human-machine interaction. Certainly, the haptic feedback device may further be used in the fields of medical treatment, automotive electronics, motion tracking systems, etc. according to actual needs, and not described in detail herein.

A vibration panel and a drive method therefor, and a haptic feedback device are provided in the embodiments of the present disclosure. The vibration panel is internally provided with the regulation structure, and then the regulation structure may regulate the characteristic frequency and a resonant mode of the substrate, such that the resonant frequency of the substrate satisfies a preset range. The preset range falls within a sensitive frequency range (400 Hz-600 Hz) of a tactile organ of a person, and using the resonant frequency of the substrate may effectively improve a haptic feedback effect of the haptic feedback device based on piezoelectric film excitation vibration in a low frequency range.

While the preferred embodiments of the present disclosure have been described, additional alterations and modifications to those embodiments may be made by those skilled in the art once the basic inventive concept is apparent to those skilled in the art. Thus, it is intended that the appended claims is to be interpreted to include the preferred embodiments and all alterations and modifications that fall within the scope of the present disclosure.

It will be apparent to those skilled in the art that various modifications and variations can be made to the embodiments of the present disclosure without departing from the spirit and scope of the embodiments of the present disclosure. Thus, if modifications and variations to the present disclosure fall within the scope of the appended claims and their equivalents, it is intended that the disclosure cover such modifications and variations as well.

What is claimed is:

1. A vibration panel, comprising:
   a substrate;
   a piezoelectric sensor on a side of the substrate, wherein the piezoelectric sensor driven by an excitation signal is configured to vibrate, and to drive the substrate to vibrate; and
   a regulation structure configured to regulate a characteristic frequency of the substrate, so as to make a resonant frequency of the substrate satisfy a preset range; wherein the regulation structure comprises a support layer fixedly connected to the substrate;
   wherein the support layer and the piezoelectric sensor are located on a same side of the substrate; and the support layer comprises: a first support portion, located in a peripheral area of the substrate and arranged around the piezoelectric sensor.

2. The vibration panel according to claim 1, wherein a plurality of first support portions are provided, and a shape of an orthographic projection of each of the first support portions on the substrate comprises a rectangle, a triangle, a circle, a trapezoid, or a polygon.

3. The vibration panel according to claim 1, wherein a plurality of first support portions are provided;
   a shape of an orthographic projection of each of first support portions at four corners of the substrate on the substrate is an L shape; and
   a shape of an orthographic projection of each of remaining first support portions on the substrate comprises a rectangle, a triangle, a circle, a trapezoid, or a polygon.

4. The vibration panel according to claim 1, wherein the first support portion is of a closed annular structure arranged around the piezoelectric sensor.

5. The vibration panel according to claim 1, wherein the piezoelectric sensor comprises a plurality of piezoelectric devices distributed in an array, and the support layer further comprises:
   a second support portion at a gap between adjacent piezoelectric devices.

6. The vibration panel according to claim 5, wherein a shape of an orthographic projection of the second support portion on the substrate comprises a rectangle, a triangle, a circle, a trapezoid, or a polygon.

7. The vibration panel according to claim 5, wherein a plurality of the second support portions are provided between every two adjacent columns of piezoelectric devices, and the second support portion is provided at a central position of every two adjacent rows and two adjacent columns of piezoelectric devices.

8. The vibration panel according to claim 1, wherein a material of the support layer comprises at least one of rubber, polyfoam, foam, and polydimethylsiloxane.

9. A haptic feedback device, comprising the vibration panel according to claim 1.

10. A drive method for driving the vibration panel according to claim 1, comprising:
varying a parameter of the regulation structure, to regulate a characteristic frequency of the substrate, so as to make the resonant frequency of the substrate satisfy the preset range; and
loading the excitation signal onto the piezoelectric sensor, wherein the piezoelectric sensor deforms to drive the substrate to vibrate.

11. The vibration panel according to claim 1, wherein the regulation structure further comprises a weight layer fixedly connected to the substrate.

12. The vibration panel according to claim 11, wherein the weight layer and the piezoelectric sensor are located on a same side of the substrate.

13. The vibration panel according to claim 12, wherein the piezoelectric sensor comprises a plurality of piezoelectric devices distributed in an array, and the weight layer comprises a mass block located at a gap between adjacent piezoelectric devices.

14. The vibration panel according to claim 13, wherein a plurality of the mass blocks are provided between every two adjacent columns of piezoelectric devices, and the mass block is provided at a central position of every two adjacent rows and two adjacent columns of piezoelectric devices.

15. The vibration panel according to claim 14, wherein a shape of an orthographic projection of each of the mass blocks on the substrate comprises at least one of a rectangle, a circle, and a polygon.

16. The vibration panel according to claim 1, wherein the regulation structure further comprises a regulation film layer fixedly connected to the substrate.

17. The vibration panel according to claim 16, wherein the regulation film layer is located on a side of the substrate facing away from the piezoelectric sensor.

18. The vibration panel according to claim 17, further comprising:
a touch layer on a side of the substrate facing away from the piezoelectric sensor;
wherein the regulation film layer is on a side of the touch layer facing away from the substrate, or the regulation film layer is between the substrate and the touch layer.

19. The vibration panel according to claim 17, wherein a material of the regulation film layer comprises polyethylene terephthalate, polymethyl methacrylate or polyimide.

* * * * *